(12) United States Patent
Ichikawa et al.

(10) Patent No.: US 11,267,992 B2
(45) Date of Patent: Mar. 8, 2022

(54) FILM-SHAPED FIRING MATERIAL AND FILM-SHAPED FIRING MATERIAL WITH SUPPORT SHEET

(71) Applicant: LINTEC CORPORATION, Tokyo (JP)

(72) Inventors: Isao Ichikawa, Tokyo (JP); Hidekazu Nakayama, Tokyo (JP); Akinori Sato, Tokyo (JP)

(73) Assignee: LINTEC Corporation, Tokyo (JP)

( * ) Notice: Subject to any disclaimer, the term of this patent is extended or adjusted under 35 U.S.C. 154(b) by 0 days.

(21) Appl. No.: 16/646,546

(22) PCT Filed: Sep. 4, 2018

(86) PCT No.: PCT/JP2018/032763
§ 371 (c)(1),
(2) Date: Mar. 11, 2020

(87) PCT Pub. No.: WO2019/054237
PCT Pub. Date: Mar. 21, 2019

(65) Prior Publication Data
US 2020/0277515 A1    Sep. 3, 2020

(30) Foreign Application Priority Data

Sep. 15, 2017 (JP) .............................. JP2017-177653
May 16, 2018 (JP) .............................. JP2018-094575
May 22, 2018 (JP) .............................. JP2018-098014

(51) Int. Cl.
*C09J 7/10*   (2018.01)
*C09J 11/04*  (2006.01)
(Continued)

(52) U.S. Cl.
CPC ................ *C09J 7/10* (2018.01); *C09J 11/04* (2013.01); *H01L 21/6835* (2013.01);
(Continued)

(58) Field of Classification Search
CPC . H01L 2224/29083; H01L 2224/29387; H01L 2224/29339; H01L 21/6836
See application file for complete search history.

(56) References Cited

U.S. PATENT DOCUMENTS

2014/0159229 A1* 6/2014 Shin .................. H01L 24/27
                                             257/734
2017/0369744 A1   12/2017 Sugo et al.

FOREIGN PATENT DOCUMENTS

EP   3 618 108 A1   3/2020
EP   3 666 429 A1   6/2020
(Continued)

OTHER PUBLICATIONS

International Search Report for PCT/JP2018/032763 dated Nov. 20, 2018, 3 pages.
(Continued)

*Primary Examiner* — Moazzam Hossain
*Assistant Examiner* — Stanetta D Isaac
(74) *Attorney, Agent, or Firm* — Nixon & Vanderhye P.C.

(57) ABSTRACT

The present invention provides a film-shaped firing material 1 including sinterable metal particles 10, and a binder component 20, in which a content of the sinterable metal particles 10 is in a range of 15% to 98% by mass, a content of the binder component 20 is in a range of 2% to 50% by mass, a tensile elasticity of the film-shaped firing material at 60° C. is in a range of 4.0 to 10.0 MPa, and a breaking elongation thereof at 60° C. is 500% or greater; and a film-shaped firing material with a support sheet including the film-shaped firing material 1 which contains sinterable metal particles and a binder component, and a support sheet 2 which is provided on at least one side of the film-shaped firing material, in which an adhesive force (a2) of the film-shaped firing material to the support sheet is smaller than an adhesive force (a1) of the film-shaped firing material (Continued)

to a semiconductor wafer, the adhesive force (a1) is 0.1 N/25 mm or greater, and the adhesive force (a2) is in a range of 0.1 N/25 mm to 0.5 N/25 mm.

8 Claims, 3 Drawing Sheets

(51) Int. Cl.
  *H01L 21/683*  (2006.01)
  *H01L 21/78*  (2006.01)
  *H01L 23/00*  (2006.01)

(52) U.S. Cl.
  CPC .............. *H01L 21/78* (2013.01); *H01L 24/27* (2013.01); *H01L 24/29* (2013.01); *H01L 24/83* (2013.01); *C09J 2203/326* (2013.01); *C09J 2400/16* (2013.01); *C09J 2433/00* (2013.01); *H01L 2221/68327* (2013.01); *H01L 2221/68386* (2013.01); *H01L 2224/27002* (2013.01); *H01L 2224/27003* (2013.01); *H01L 2224/8384* (2013.01); *H01L 2224/83191* (2013.01); *H01L 2924/20102* (2013.01); *H01L 2924/20103* (2013.01)

(56) References Cited

FOREIGN PATENT DOCUMENTS

| JP | 2005-276925 A | 10/2005 |
|---|---|---|
| JP | 2014-111800 | 6/2014 |
| JP | 2015-198116 | 11/2015 |
| JP | 2015-211079 | 11/2015 |
| JP | 2016-121329 | 7/2016 |
| TW | 201431992 A | 8/2014 |

OTHER PUBLICATIONS

Grounds for Rejection dated Dec. 1, 2020 in Korean Application No. 10-2020-7006856, with English translation, 15 pages.
Extended European Search Report dated Aug. 10, 2021 in European Application No. 18856172.4, 15 pages.
Taiwanese Office Action dated Nov. 5, 2021 in Taiwanese Application No. 107132045, with partial English translation, 7 pages.

* cited by examiner

FILM-SHAPED FIRING MATERIAL AND FILM-SHAPED FIRING MATERIAL WITH SUPPORT SHEET

TECHNICAL FIELD

The present invention relates to a film-shaped firing material and a film-shaped firing material with a support sheet.

This application is the U.S. national phase of International Application No. PCT/JP2018/032763 filed on Sep. 4, 2018 which designated the U.S. and claims priority to Japanese Patent Application No. 2017-177653, filed on Sep. 15, 2017, Japanese Patent Application No. 2018-94575, filed on May 16, 2018, and Japanese Patent Application No. 2018-98014, filed on May 22, 2018, the entire contents of each of which are incorporated herein by reference.

BACKGROUND ART

In recent years, with the high voltage and high current of automobiles, air conditioners, and personal computers, the demand for power semiconductor elements (power devices) to be mounted on these has increased. Since a power semiconductor element is used in a high-voltage and high-current environment, generation of heat from the semiconductor element may become a problem.

In the related art, a heat sink is attached to the periphery of a semiconductor element in some cases for the purpose of heat dissipation of heat generated from the semiconductor element. However, in a case where the thermal conductivity in a portion where the heat sink and the semiconductor element are bonded is not excellent, efficient heat dissipation is affected.

As a bonding material with excellent thermal conductivity, for example, Patent Literature 1 discloses a paste-like metal fine particle composition in which specific heat-sinterable metal particles, a specific polymer dispersant, and a specific volatile dispersion medium are mixed. It is considered that a solid metal with excellent thermal conductivity is obtained in a case where the composition is sintered.

CITATION LIST

Patent Literature

[Patent Document 1] Japanese Unexamined Patent Application, First Publication No. 2014-111800

DISCLOSURE OF INVENTION

Technical Problem

However, in a case where a firing material is in the form of a paste as described in Patent Document 1, the thickness of the paste to be applied is unlikely to be uniform, and the thickness stability tends to be poor. In order to solve the problem of the thickness stability, the present inventors considered providing a firing material, which has been provided as a paste-like composition of the related art, in the form of a film.

A firing material may be formed into a film by blending a binder component with the firing material. In consideration of the sublimability of the film-shaped firing material, it is preferable that the content of the sinterable metal particles in the film-shaped firing material be large and the content of the binder component be small.

Meanwhile, the firing material is used for sinter bonding of a substrate and chips which have been divided by dicing a semiconductor wafer or the like. Further, in a case where a support sheet is provided on one side (surface) of the film-shaped firing material, the support sheet can be used as a dicing sheet used for dividing a semiconductor wafer into chips. In addition, the film-shaped firing material having the same shape as the shape of chip can be processed by being divided together with the semiconductor wafer using a blade.

However, the film-shaped firing material tends to be brittle in a case where the content of the binder component in the film-shaped firing material is small. In a case where the film-shaped firing material becomes brittle, the firing material is scraped by a blade during the dicing, and thus shavings are likely to be generated. The shavings adhere to a surface of the semiconductor wafer and cause contamination of the semiconductor wafer.

In order to eliminate the brittleness of the film-shaped firing material, the film-shaped firing material may be softened. However, in a case where the flexibility is extremely high, the film-shaped firing material vibrates during the dicing. As a result, the chips are likely to collide with each other, and thus chipping is likely to occur in the surface or the side surface of each chip.

As described above, since prevention of contamination of a wafer and prevention of chipping are in a trade-off relationship, it is difficult to suppress both contamination of a wafer and chipping.

Further, in a case where the adhesive force of the film-shaped firing material to the semiconductor wafer decreases, so-called "chip jump" in which chips are scattered due to friction with the blade during the dicing is likely to occur.

Further, in a case where the adhesive force of the film-shaped firing material to the support sheet decreases, the firing material is scattered during the dicing, and the scattered firing material adheres to the surface of the semiconductor wafer and may cause contamination of the semiconductor wafer. On the contrary, in a case where the adhesive force of the film-shaped firing material to the support sheet increases, the film-shaped firing material is unlikely to be peeled off from the support sheet at the time of picking up the divided chips obtained by dicing the semiconductor wafer, and thus the diced chips with the film-shaped firing material cannot be stably picked up.

The present invention has been made in consideration of the above-described circumstances, and an object thereof is to provide a film-shaped firing material which has excellent thickness stability and is capable of suppressing chipping and contamination of a wafer during dicing. Further, another object thereof is to provide a film-shaped firing material with a support sheet which includes the film-shaped firing material, a film-shaped firing material with a support sheet which is capable of suppressing chipping and contamination of a wafer during dicing, and is capable of stably picking up diced chips with the film-shaped firing material; and a method of manufacturing a semiconductor device obtained by using the film-shaped firing material with a support sheet.

Solution to Problem

The present invention includes the following aspects.

[1] A film-shaped firing material including: sinterable metal particles; and a binder component, in which a content of the sinterable metal particles is in a range of 15% to 98% by mass, a content of the binder component is in a range of 2% to 50% by mass, a tensile elasticity of the film-shaped firing material at 60° C. is in a range of 4.0 to 10.0 MPa, and a breaking elongation thereof at 60° C. is 500% or greater.

[2] The film-shaped firing material according to [1], in which a tensile elasticity of the film-shaped firing material at 23° C. is in a range of 5.0 to 20.0 MPa, and a breaking elongation thereof at 23° C. is 300% or greater.

[3] The film-shaped firing material according to [1] or [2], in which a glass transition temperature of components obtained by removing sinterable metal particles from components constituting the film-shaped firing material before being fired is in a range of 30° C. to 70° C.

[4] A film-shaped firing material with a support sheet, including: the film-shaped firing material according to any one of [1] to [3]; and a support sheet which is provided on at least one side of the film-shaped firing material.

[5] A film-shaped firing material with a support sheet, including: a film-shaped firing material which contains sinterable metal particles and a binder component; and a support sheet which is provided on at least one side of the film-shaped firing material, in which an adhesive force (a2) of the film-shaped firing material to the support sheet is smaller than an adhesive force (a1) of the film-shaped firing material to a semiconductor wafer, and the adhesive force (a1) is 0.1 N/25 mm or greater and the adhesive force (a2) is in a range of 0.1 N/25 mm to 0.5 N/25 mm.

[6] The film-shaped firing material with a support sheet according to [4], in which a content of the sinterable metal particles in the film-shaped firing material is in a range of 15% to 98% by mass, a content of the binder component therein is in a range of 2% to 50% by mass, a tensile elasticity of the film-shaped firing material at 60° C. is in a range of 4.0 to 10.0 MPa, and a breaking elongation thereof at 60° C. is 500% or greater.

[7] The film-shaped firing material with a support sheet according to any one of [4] to [6], in which the support sheet includes a base film and a pressure-sensitive adhesive layer provided on the base film, and the film-shaped firing material is provided on the pressure-sensitive adhesive layer.

[8] A method of manufacturing a semiconductor device using the film-shaped firing material with a support sheet according to any one of [4] to [7], the method including the following steps (1) to (4) in order:

a step (1) of dicing a semiconductor wafer and a film-shaped firing material of a laminate which is obtained by attaching the film-shaped firing material with a support sheet to the semiconductor wafer and in which a support sheet, the film-shaped firing material, and the semiconductor wafer are laminated in this order;

a step (2) of peeling the support sheet off from the diced film-shaped firing material to obtain a chip with the film-shaped firing material;

a step (3) of attaching the chip with the film-shaped firing material to a surface of a substrate; and a step (4) of firing the film-shaped firing material of the chip with the film-shaped firing material and bonding the chip with the film-shaped firing material and the substrate to each other.

Advantageous Effects of Invention

According to the present invention, it is possible to provide a film-shaped firing material which has excellent thickness stability and is capable of suppressing chipping and contamination of a wafer during dicing. Further, it is possible to provide a film-shaped firing material with a support sheet which includes the film-shaped firing material, and is used for sinter bonding of chips of a semiconductor element or the like, a film-shaped firing material with a support sheet which is capable of suppressing chipping and contamination of a wafer during dicing, and is capable of stably picking up diced chips with the film-shaped firing material; and a method of manufacturing a semiconductor device obtained by using the film-shaped firing material with a support sheet.

BEST MODE FOR CARRYING OUT THE INVENTION

Hereinafter, an embodiment of the present invention will be appropriately described with reference to the accompanying drawings.

Further, the drawings used in the description below are shown by enlarging main portions for convenience in order to facilitate understanding of the features of the present invention, and the dimensional ratio and the like of each constituent element are not necessarily the same as the actual ratio.

<<Film-Shaped Firing Material>>

A film-shaped firing material according to the present embodiment is a film-shaped firing material which contains sinterable metal particles and a binder component, in which the content of the sinterable metal particles is in a range of 15% to 98% by mass, the content of the binder component is in a range of 2% to 50% by mass, the tensile elasticity of the film-shaped firing material at 60° C. is in a range of 4.0 to 10.0 MPa, and the breaking elongation thereof at 60° C. is 500% or greater. Here, the content of the sinterable metal particles or the content of the binder component indicates the content thereof with respect to the total mass (100% by mass) of all components other than the solvent in the film-shaped firing material according to the present embodiment. Further, the total content of the sinterable metal particles and the binder component does not exceed 100% by mass.

In the present invention, the film-shaped firing material indicates the material before being fired unless otherwise specified.

Figure 1:
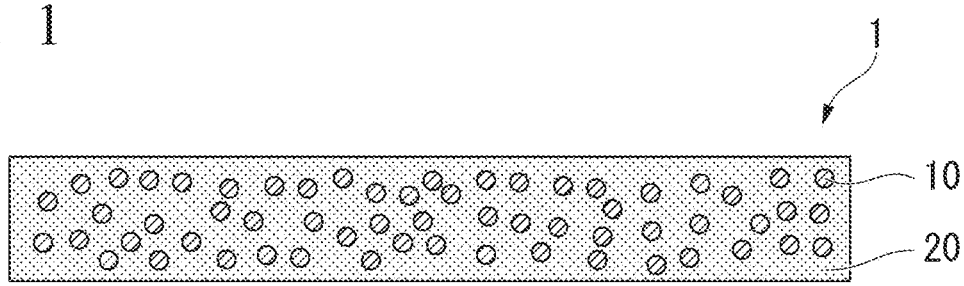
FIG. 1 is a cross-sectional view schematically illustrating a film-shaped firing material according to an embodiment of the present invention.

FIG. 1 is a cross-sectional view schematically illustrating a film-shaped firing material according to the present embodiment. A film-shaped firing material 1 contains sinterable metal particles 10 and a binder component 20.

The film-shaped firing material may be formed of one layer (single layer) or two or more of a plurality of layers, for example, two to ten layers. In a case where the film-shaped firing material is formed of a plurality of layers, the plurality of layers may be the same as or different from one another, and a combination of the plurality of layers is not particularly limited as long as the effects of the present invention are not affected.

Further, in the present specification, the expression "the plurality of layers may be the same as or different from one another" means that "all layers may be the same as one another, all layers may be different from one another, or only some layers may be the same as one another" and the expression "the plurality of layers are different from one another" means that "at least one of the constituent materials of each layer, the compounding ratios of constituent materials, and the thicknesses of layers are different from one another" without limiting to the case of the film-shaped firing material.

The thickness of the film-shaped firing material before being fired is not particularly limited, but is preferably in a range of 10 to 200 μm, preferably in a range of 20 to 150 μm, and more preferably in a range of 30 to 90 μm.

Here, the "thickness of the film-shaped firing material" indicates the thickness of the entire film-shaped firing material. For example, the thickness of the film-shaped firing material formed of a plurality of layers indicates the total thickness of all layers constituting the film-shaped firing material.

In the present specification, the "thickness" can be acquired using a constant pressure thickness-measuring device in conformity with JIS K7130 as a value obtained by averaging the measured thicknesses at five optional sites.

(Release Film)

The film-shaped firing material can be provided in a state of being laminated on a release film. At the time of use, the release film may be peeled off and disposed on an object to which the film-shaped firing material is sinter-bonded. The release film also has a function as a protective film to prevent damage to the film-shaped firing material and adhesion of dirt. The release film may be provided on at least one side of the film-shaped firing material or on both sides of the film-shaped firing material. In a case where the release film is provided on both sides of the film-shaped firing material, the release film on one side functions as a support sheet.

Examples of the release film include transparent films such as a polyethylene film, a polypropylene film, a polybutene film, a polybutadiene film, a polymethyl pentene film, a polyvinyl chloride film, a vinyl chloride copolymer film, a polyethylene terephthalate film, a polyethylene naphthalate film, a polybutylene terephthalate film, a polyurethane film, an ethylene vinyl acetate copolymer film, an ionomer resin film, an ethylene-(meth)acrylic acid copolymer film, an ethylene-(meth)acrylic acid ester copolymer film, a polystyrene film, a polycarbonate film, a polyimide film, and a fluorine resin film. Further, crosslinked films of these can also be used. Further, laminated films of these may also be used. Further, films obtained by coloring these films and opaque films can also be used. Examples of a release agent include a silicone-based release agent, a fluorine-based release agent, an olefin-based release agent, an alkyd-based release agent, and a long-chain alkyl group-containing carbamate.

The thickness of the release film is typically in a range of 10 to 500 μm, preferably in a range of 15 to 300 μm, and particularly preferably in a range of 20 to 250

<Sinterable Metal Particles>

The sinterable metal particles are metal particles which can be fused and bonded to form a sintered body by being subjected to a heat treatment at a temperature of the melting point of the metal particles or higher as firing of the film-shaped firing material. The formation of the sintered body enables sinter bonding of the film-shaped firing material and a fired product in contact with the film-shaped firing material. Specifically, the chips and the substrate can be sinter-bonded through the film-shaped firing material.

Examples of the metal species of the sinterable metal particles include silver, gold, copper, iron, nickel, aluminum, silicon, palladium, platinum, titanium, barium titanate, and oxides or alloys of these. Among these, silver and silver oxide are preferable. Only one kind of metal or a combination of two or more kinds of metals may be blended into the sinterable metal particles.

It is preferable that the sinterable metal particles be silver nanoparticles which are silver particles having a particle diameter of 100 nm or less, preferably 50 nm or less, and more preferably 20 nm or less.

The particle diameter of the sinterable metal particles contained in the film-shaped firing material is not particularly limited as long as sinterability can be exhibited, but may be 100 nm or less, 50 nm or less, or 30 nm or less. For example, it is preferable that the content of sinterable metal particles having a particle diameter of 100 nm or less be 20% by mass or greater with respect to the total amount of the entire particles. Further, the particle diameter of the sinterable metal particles contained in the film-shaped firing material is set as a projected area circle equivalent diameter of the particle diameter of the sinterable metal particles observed using an electron microscope. The sinterable metal particles with the particle diameter in the above-described range are preferable from the viewpoint of excellent sinterability.

In the particle diameter of the sinterable metal particles contained in the film-shaped firing material, the number average of the particle diameters acquired using particles whose projected area circle equivalent diameters of the particle diameters of the sinterable metal particles observed using an electron microscope are 100 nm or less may be in a range of 0.1 to 95 nm, in a range of 0.3 to 50 nm, or in a range of 0.5 to 30 nm. Further, the number of sinterable metal particles to be measured is set to 100 or more, for example, 100 particles randomly selected per one film-shaped firing material.

Since the sinterable metal particles are set to be in a state in which aggregates are eliminated in advance before binder components and other additive components described below are mixed with the sinterable metal particles, the sinterable metal particles may be dispersed in a high-boiling-point solvent having a high boiling point such as isobornyl cyclohexanol or decyl alcohol. The boiling point of the high-boiling-point solvent may be, for example, in a range of 200° C. to 350° C. At this time, in a case where the high-boiling-point solvent is used, since the solvent is unlikely to volatilize at room temperature, an increase in concentration of the sinterable metal particles is prevented, the workability is improved, and the re-aggregation and the like of the sinterable metal particles are also prevented so that the quality thereof becomes satisfactory. As the dispersion method, the dispersion may be carried out using a kneader, a triple roll, a bead mill, or ultrasonic waves.

Metal particles (sinterable metal particles) having a particle diameter of 100 nm or less and non-sinterable metal particles having a particle diameter of greater than 100 nm that do not correspond to the metal particles may further be blended into the film-shaped firing material according to the present embodiment. Further, the particle diameter of the non-sinterable metal particles is set as a projected area circle equivalent diameter of the particle diameter of the non-sinterable metal particles observed using an electron microscope. The particle diameter of the non-sinterable metal particles may be, for example, greater than 100 nm and less than or equal to 5000 nm, and it is preferable that the content thereof having a particle diameter of 100 nm to 2500 nm be 5% by mass or greater with respect to the total amount of the entire particles. In the particle diameter of the non-sinterable metal particles having a particle diameter of greater than 100 nm, the number average of the particle diameters acquired using particles whose projected area circle equivalent diameters of the particle diameters of the metal particles observed using an electron microscope are greater than 100 nm may be greater than 150 nm and 50000 nm or less, in a range of 150 to 10000 nm, or in a range of 180 to 5000 nm.

Examples of the metal species of the non-sinterable metal particles having a particle diameter of greater than 100 nm are the same as those exemplified as the metal species of the sinterable metal particles. Among these, silver, copper, and oxides of these are preferable.

The sinterable metal particles having a particle diameter of 100 nm or less and the non-sinterable metal particles having a particle diameter of greater than 100 nm may be the metal species which are the same as or different from each other. For example, the sinterable metal particles having a particle diameter of 100 nm or less may be silver particles and the non-sinterable metal particles having a particle diameter of greater than 100 nm may be silver particles or silver oxide particles. For example, the sinterable metal particles having a particle diameter of 100 nm or less may be silver particles or silver oxide particles and the non-sinterable metal particles having a particle diameter of greater than 100 nm may be copper particles or copper oxide particles.

In the film-shaped firing material according to the present embodiment, the content of the sinterable metal particles may be in a range of 10% to 100% by mass or may be in a range of 20% to 95% by mass with respect to the total mass (100% by mass) of all metal particles.

The surface of the sinterable metal particle and/or the surface of the non-sinterable metal particle may be coated with an organic substance. In a case where the film-shaped firing material has a film coated with an organic substance, the compatibility with a binder component is improved. Further, aggregation of particles can be prevented, and the particles can be uniformly dispersed.

In a case where the surface of the sinterable metal particle and/or the surface of the non-sinterable metal particle is coated with an organic substance, the mass of the sinterable metal particle and the non-sinterable metal particle is set as a value of the mass including the coated substance.

<Binder Component>

In a case where a binder component is blended into the film-shaped firing material, the firing material can be formed in a film shape, and tackiness can be imparted to the film-shaped firing material before being fired. The binder component may be thermally decomposable, that is, thermally decomposed by being subjected to a heat treatment as firing of the film-shaped firing material.

The binder component is not particularly limited, and suitable examples of the binder component include resins. Examples of the resins include an acrylic resin, a polycarbonate resin, polylactic acid, and a polymer of a cellulose derivative. Among these, an acrylic resin is preferable. The acrylic resin includes a homopolymer of a (meth)acrylate compound, two or more copolymers of a (meth)acrylate compound, and a copolymer of a (meth)acrylate compound and another copolymer monomer.

The content of the constituent unit derived from the (meth)acrylate compound in the resin constituting the binder component is preferably in a range of 50% to 100% by mass, more preferably in a range of 80% to 100% by mass, and still more preferably in a range of 90% to 100% by mass with respect to the total mass (100% by mass) of the constituent units.

Here, the term "derived" means that the monomer has undergone a structural change necessary for polymerization.

Specific examples of the (meth)acrylate compound include alkyl (meth)acrylate such as methyl (meth)acrylate, ethyl (meth)acrylate, propyl (meth)acrylate, isopropyl (meth)acrylate, butyl (meth)acrylate, isobutyl (meth)acrylate, t-butyl (meth)acrylate, pentyl (meth)acrylate, amyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, or isostearyl (meth)acrylate;

hydroxyalkyl (meth)acrylate such as hydroxyethyl (meth)acrylate, 2-hydroxypropyl (meth)acrylate, 4-hydroxybutyl (meth)acrylate, 3-hydroxypropyl (meth)acrylate, 2-hydroxybutyl (meth)acrylate or 3-hydroxybutyl (meth)acrylate; phenoxyalkyl (meth)acrylate such as phenoxyethyl (meth)acrylate, 2-hydroxy-3-phenoxypropyl (meth)acrylate;

alkoxyalkyl (meth)acrylate such as 2-methoxyethyl (meth)acrylate, 2-ethoxyethyl (meth)acrylate, 2-propoxyethyl (meth)acrylate, 2-butoxyethyl (meth)acrylate, or 2-methoxybutyl (meth)acrylate;

polyalkylene glycol (meth)acrylate such as polyethylene glycol mono(meth)acrylate, ethoxy diethylene glycol (meth)acrylate, methoxy polyethylene glycol (meth)acrylate, phenoxy polyethylene glycol (meth)acrylate, nonyl phenoxy polyethylene glycol (meth)acrylate, polypropylene glycol mono(meth)acrylate, methoxy polypropylene glycol (meth)acrylate, ethoxy polypropylene glycol (meth)acrylate, or nonyl phenoxy polypropylene glycol (meth)acrylate;

cycloalkyl (meth)acrylate such as cyclohexyl (meth)acrylate, 4-butyl cyclohexyl (meth)acrylate, dicyclopentanyl (meth)acrylate, dicyclopentenyl (meth)acrylate, dicyclopentadienyl (meth)acrylate, bornyl (meth)acrylate, isobornyl (meth)acrylate, or tricyclodecanyl (meth)acrylate; and benzyl (meth)acrylate, and tetrahydrofurfuryl (meth)acrylate. Among these, alkyl (meth)acrylate or alkoxyalkyl (meth)acrylate is preferable. As a particularly preferable (meth)acrylate compound, butyl (meth)acrylate, ethylhexyl (meth)acrylate, lauryl (meth)acrylate, isodecyl (meth)acrylate, 2-ethylhexyl (meth)acrylate, and 2-ethoxyethyl (meth)acrylate are exemplified.

In the present specification, "(meth)acrylate" includes both of "acrylate" and "methacrylate".

As an acrylic resin, methacrylate is preferable. In a case where the binder component has a constituent unit derived from methacrylate, the film-shaped firing material can be fired at a relatively low temperature, and the conditions for sufficiently obtaining the adhesive strength after the material is sintered can be easily satisfied.

The content of the constituent unit derived from methacrylate in the resin constituting the binder component is preferably in a range of 50% to 100% by mass, more preferably in a range of 80% to 100% by mass, and still more preferably in a range of 90% to 100% by mass with respect to the total mass (100% by mass) of the constituent units.

Another copolymer monomer is not particularly limited as long as the compound can be copolymerized with the (meth)acrylate compound, and examples thereof include unsaturated carboxylic acids such as (meth)acrylic acid, vinyl benzoic acid, maleic acid, and vinyl phthalic acid; and a vinyl group-containing radically polymerizable compound such as vinyl benzyl methyl ether, vinyl glycidyl ether, styrene, α-methylstyrene, butadiene, or isoprene.

The mass-average molecular weight (Mw) of the resin constituting the binder component is preferably in a range of 1000 to 1000000 and more preferably in a range of 10000 to 800000. In a case where the mass-average molecular weight of the resin is in the above-described range, the film exhibits sufficient film hardness, and the flexibility can be easily imparted to the film.

In the present specification, the "mass-average molecular weight" is a value in terms of polystyrene which is measured according to the gel permeation chromatography (GPC) method unless otherwise specified.

The glass transition temperature (Tg) of the resin constituting the binder component can be acquired using the Fox's formula shown below, and is preferably in a range of −60° C. to 50° C., more preferably in a range of −30° C. to 10° C., and still more preferably −20° C. or higher and lower than 0° C. In a case where the Tg of the resin acquired using the Fox's formula is lower than or equal to the above-described upper limit, the adhesive force between the film-shaped firing material and an adherend (for example, a chip or a substrate) before firing of the material is improved. In addition, the flexibility of the film-shaped firing material is improved. Further, in a case where the Tg of the resin acquired using the Fox's formula is higher than or equal to the above-described lower limit, the film shape can be maintained, and the film-shaped firing material is more easily pulled apart from the support sheet or the like.

$$1/Tg=(W1/Tg1)+(W2/Tg2)+\ldots+(Wm/Tgm)$$

(In the formula, the Tg represents the glass transition temperature of a resin constituting a binder component, Tg1, Tg2, . . . , Tgm represent the glass transition temperature of a homopolymer of each monomer which becomes a raw material of a resin constituting the binder component, and W1, W2, . . . , Wm represent the mass fraction of each monomer. Here, W1+W2+ . . . +Wm is 1.)

The glass transition temperature of the homopolymer of each monomer according to the Fox's formula can be acquired using values described in Polymer Data Handbook or Handbook of Pressure-sensitive Adhesion.

The binder component may be thermally decomposable, that is, thermally decomposed by being subjected to a heat treatment as firing of the film-shaped firing material. The thermal decomposition of the binder component can be confirmed from a decrease in mass of the binder component due to firing. Further, a component to be blended as the binder component may be almost thermally decomposed due to firing, but the entire component to be blended as the binder component may not be thermally decomposed due to firing.

The mass of the binder component after being fired may be 10% by mass or less, 5% by mass or less, 3% by mass or less, or 0% by mass with respect to the total mass (100% by mass) of the binder component before being fired.

In addition to the sinterable metal particles, the non-sinterable metal particles, and the binder component, the film-shaped firing material according to the present embodiment may contain other additives that do not correspond to the sinterable metal particles, the non-sinterable metal particles, and the binder component, within a range where the effects of the present invention are not affected.

Examples of other additives which may be contained in the film-shaped firing material according to the present embodiment include a solvent, a dispersant, a plasticizer, a tackifier, a storage stabilizer, an antifoaming agent, a thermal decomposition accelerator, and an antioxidant. The film-shaped firing material may contain only one or two or more kinds of additives. These additives are not particularly limited and can be appropriately selected from those which have been typically used in this field.

<Composition>

The film-shaped firing material according to the present embodiment may be formed of the sinterable metal particles, the binder component, and other additives, and the total content (% by mass) of these is 100% by mass.

In a case where the film-shaped firing material according to the present embodiment contains the non-sinterable metal particles, the film-shaped firing material may be formed of the sinterable metal particles, the non-sinterable metal particles, the binder component, and other additives, and the total content (% by mass) of these is 100% by mass.

The content of the sinterable metal particles in the film-shaped firing material is in a range of 15% to 98% by mass, more preferably in a range of 15% to 90% by mass, and still more preferably in a range of 20% to 80% by mass with respect to the total mass (100% by mass) of all components other than the solvent (hereinafter, also noted as the "solid content"). In a case where the content of the sinterable metal particles is less than or equal to the above-described upper limit, the content of the binder component can be sufficiently ensured, and thus the film shape can be maintained. Meanwhile, in a case where the content of the sinterable metal particles is greater than or equal to the above-described lower limit, the sinterable metal particles or the sinterable metal particles and the non-sinterable metal particles are fused at the time of being fired so that high bonding adhesive strength (shear adhesive force) is exhibited after the particles are fired.

In a case where the film-shaped firing material contains the non-sinterable metal particles, the total content of the sinterable metal particles and the non-sinterable metal particles is preferably in a range of 50% to 98% by mass, more preferably in a range of 70% to 95% by mass, and still more preferably in a range of 80% to 90% by mass with respect to the total mass (100% by mass) of the solid content in the film-shaped firing material.

The content of the binder component is in a range of 2% to 50% by mass, preferably in a range of 5% to 30% by mass, and more preferably in a range of 5% to 20% by mass with respect to the total mass (100% by mass) of the solid content in the film-shaped firing material. In a case where the content of the binder component is less than or equal to the above-described upper limit, the content of the sinterable metal particles can be sufficiently ensured, and thus the bonding adhesive force between the film-shaped firing material and the adherend is improved. In a case where the content of the binder component is greater than or equal to the above-described lower limit, the film shape can be maintained.

The mass ratio (sinterable metal particles:binder component) of the sinterable metal particles to the binder component in the film-shaped firing material is preferably in a range of 50:1 to 1:5, more preferably in a range of 20:1 to 1:2, and still more preferably in a range of 10:1 to 1:1. In a case where the film-shaped firing material contains the non-sinterable metal particles, the mass ratio ((sinterable metal particles+non-sinterable metal particles):binder component) of the sinterable metal particles and the non-sinterable metal particles to the binder component is preferably in a range of 50:1 to 1:1, more preferably in a range of 20:1 to 2:1, and still more preferably in a range of 9:1 to 4:1.

The film-shaped firing material may contain the above-described high-boiling-point solvent used at the time of mixing the sinterable metal particles, the non-sinterable metal particles, the binder component, and other additive components. The content of the high-boiling-point solvent is preferably 20% by mass or less, more preferably 15% by mass or less, and still more preferably 10% by mass or less with respect to the total mass (100% by mass) of the film-shaped firing material.

<Tensile Elasticity>

The tensile elasticity of the film-shaped firing material according to the present embodiment at 60° C. is in a range of 4.0 to 10.0 MPa. The tensile elasticity thereof at 60° C. is preferably in a range of 4.5 to 5.5 MPa. The tensile elasticity of the film-shaped firing material according to the present embodiment at 23° C. is preferably in a range of 5.0 to 20.0 MPa and more preferably in a range of 6.0 to 18.0 MPa. In a case where the tensile elasticity of the film-shaped firing material at 60° C. or 23° C. is in the above-described range, the amount thereof to be deformed due to the external force is small, and the material has toughness. Particularly in a case where the tensile elasticity thereof is less than or equal to the above-described upper limit, the film-shaped firing material is unlikely to become brittle, and the contamination of a wafer during the dicing can be suppressed. Meanwhile, in a case where the tensile elasticity thereof is greater than or equal to the above-described lower limit, the film-shaped firing material is not extremely softened so that chipping during the dicing can be suppressed.

Further, the reason why the tensile elasticity at 60° C. and the breaking elongation described below in the present embodiment are specified is that the film-shaped firing material is heated to approximately 60° C. due to the frictional heat during the dicing using a blade, but the temperature of the film-shaped firing material during actual dicing is not limited to 60° C. Further, the reason why the tensile elasticity at 23° C. and the breaking elongation described below in the present embodiment are specified is that the measurement at 23° C. is easily performed, but this does not mean that the temperature of the film-shaped firing material during the actual dicing is 23° C.

The tensile elasticity of the film-shaped firing material at 23° C. or 60° C. can be measured according to the following method.

A test piece having a width of 10 mm, a length of 20 mm, and a thickness of 200 μm is cut out from the film-shaped firing material and heated to 23° C. or 60° C., and the load and the elongation amount of the test piece at the time of stretching the test piece at a tensile rate of 50 mm/min and a distance of 10 mm between chucks are measured. The tensile elasticity is acquired from the inclination of the tensile stress in a region where the elongation is in a range of 0% to 5%.

The tensile elasticity of the film-shaped firing material at 23° C. or 60° C. can be controlled by the kind of the binder component contained in the film-shaped firing material. Specifically, the tensile elasticity thereof tends to increase as the Tg of the resin constituting the binder component increases. Further, the tensile elasticity tends to increase as the content of the sinterable metal particles increases.

<Breaking Elongation>

The breaking elongation of the film-shaped firing material according to the present embodiment at 60° C. is 500% or greater. The breaking elongation at 60° C. is preferably 600% or greater. The breaking elongation of the film-shaped firing material according to the present embodiment at 23° C. is preferably 300% or greater and more preferably 400% or greater. In a case where the breaking elongation thereof at 60° C. or 23° C. is greater than or equal to the above-described lower limit, the film-shaped firing material is unlikely to become brittle, and the contamination of a wafer during the dicing can be suppressed.

The breaking elongation of the film-shaped firing material at 60° C. is preferably 3000% or less, and the breaking elongation thereof at 23° C. is preferably 2500% or less.

The breaking elongation of the film-shaped firing material at 60° C. may be in a range of 500% to 3000% or in a range of 600% to 3000%. Further, the breaking elongation of the film-shaped firing material at 23° C. may be in a range of 300% to 2500% or in a range of 400% to 2500%.

The breaking elongation of the film-shaped firing material at 23° C. or 60° C. can be measured according to the following method.

A test piece having a width of 10 mm, a length of 20 mm, and a thickness of 200 μm is cut out from the film-shaped firing material and heated to 23° C. or 60° C., and the elongation amount of the test piece at the time of stretching the test piece at a tensile rate of 50 mm/min and a distance of 10 mm between chucks is measured. The breaking elongation of the test piece is acquired from the elongation amount at the time of stretching the test piece.

The breaking elongation of the film-shaped firing material at 23° C. or 60° C. can be controlled by the kind or the content of the binder component contained in the film-shaped firing material. Specifically, the breaking elongation thereof tends to increase as the content of the binder component increases or the Tg of the resin constituting the binder component decreases. Further, the breaking elongation tends to decrease as the content of the sinterable metal particles increases.

<Glass Transition Temperature>

In the film-shaped firing material according to the present embodiment, the glass transition temperature (hereinafter, also referred to as the "Tg of the firing material other than the metal particles") of the components obtained by removing the metal particles (the sinterable metal particles and the non-sinterable metal particles) from the components constituting the film-shaped firing material before being fired is preferably in a range of 30° C. to 70° C. and more preferably in a range of 40° C. to 60° C. In a case where the Tg of the firing material other than the metal particles is lower than or equal to the above-described upper limit, the film-shaped firing material is unlikely to become brittle, and the contamination of a wafer during the dicing can be suppressed. Meanwhile, in a case where the Tg of the firing material other than the metal particles is higher than or equal to the above-described lower limit, the film-shaped firing material is not extremely softened so that chipping during the dicing can be suppressed.

The Tg of the firing material other than the metal particles can be acquired by performing calculation using the firing material other than the metal particles in place of the resin constituting the binder component according to the Fox's formula, but can also be measured according to the following method.

A storage elasticity E' and a loss elasticity E" of the film-shaped firing material from which the metal particles have been separated are measured using a dynamic mechanical analyzer, and tan δ which is the ratio (E"/E') of the loss elasticity E" to the storage elasticity E' is plotted with respect to the temperature, and the temperature showing the maximum of tan δ is set as the Tg of the firing material.

The method of separating the metal particles and the components obtained by removing the metal particles from the film-shaped firing material is as described in the examples described below.

The Tg of the firing material can be controlled by the kind of the binder component contained in the film-shaped firing material.

According to the film-shaped firing material of the above-described embodiment, the thickness stability is excellent because the material is in the form of a film. Further, since the film-shaped firing material according to the present embodiment contains sinterable metal particles, the thermal conductivity is excellent. Further, the film-shaped firing material according to the present embodiment contains a specific amount of the sinterable metal particles and the binder component. Further, the tensile elasticity of the film-shaped firing material at 60° C. is in a range of 4.0 to 10.0 MPa, and the breaking elongation thereof at 60° C. is 500% or greater. Accordingly, the film-shaped firing material of the present embodiment has moderate hardness and toughness, chips vibrate due to the friction of a blade during the dicing, and shavings of the film-shaped firing material are unlikely to be generated. Therefore, chipping and contamination of a wafer can be suppressed, and the dicing suitability is excellent.

The film-shaped firing material can be made into a film-shaped firing material with a support sheet provided with a support sheet on at least one side (surface) thereof.

The details of the film-shaped firing material with a support sheet are as follows.

<<Method of Producing Film-Shaped Firing Material>>

The film-shaped firing material can be formed using a firing material composition containing this constituent material. For example, the film-shaped firing material can be formed in a target portion by coating or printing a surface on which the film-shaped firing material is formed with the firing material composition containing a solvent and each component for constituting the film-shaped firing material and volatilizing the solvent as necessary. The content of each component for constituting the film-shaped firing material in the firing material composition may be in a range of 50% to 99% by mass, and the content of the solvent may be in a range of 1% to 50% by mass with respect to the total amount of each component.

Examples of the surface on which the film-shaped firing material is formed include a surface of a release film.

As the solvent in a case where the surface is coated with the firing material composition, a solvent having a boiling point of lower than 200° C. is preferable. Examples thereof include n-hexane (boiling point: 68° C.), ethyl acetate (boiling point: 77° C.), 2-butanone (boiling point: 80° C.), n-heptane (boiling point: 98° C.), methyl cyclohexane (boiling point: 101° C.), toluene (boiling point: 111° C.), acetyl acetone (boiling point: 138° C.), n-xylene (boiling point: 139° C.), and dimethylformamide (boiling point: 153° C.). These solvents may be used alone or in combination.

The surface thereof may be coated with the firing material composition using a known method, and examples of the method include methods of using various coaters such as an air knife coater, a blade coater, a bar coater, a gravure coater, a Comma coater (registered trademark), a roll coater, a roll knife coater, a curtain coater, a die coater, a knife coater, a screen coater, a Meyer bar coater, and a kiss coater.

In a case where the surface is printed with the firing material composition, the solvent may be volatilized and dried after the printing, and the boiling point thereof is preferably in a range of 65° C. to 350° C. Examples of such a solvent include the above-described solvent having a boiling point of lower than 200° C., isophorone (boiling point: 215° C.), butyl carbitol (boiling point: 230° C.), 1-decanol (boiling point: 233° C.), butyl carbitol acetate (boiling point: 247° C.), and isobornyl cyclohexanol (boiling point: 318° C.).

In a case where the boiling point is higher than 350° C., at the time of volatilizing and drying the solvent after the printing, the solvent is unlikely to be volatilized, and a desired shape is unlikely to be ensured. Further, the solvent at the time of firing the material remains in the film, and thus the bonding adhesiveness may deteriorate. In a case where the boiling point is lower than 65° C., the solvent is volatilized during the printing, and thus the thickness stability may be impaired. In a case where a solvent having a boiling point of 200° C. to 350° C. is used, an increase in viscosity due to the volatilization of the solvent during the printing can be suppressed. Therefore, the printing suitability can be obtained.

The printing of the firing material composition can be performed according to a known printing method, for example, relief printing such as flexo printing, intaglio printing such as gravure printing, planographic printing such as offset printing, screen printing such as silk screen printing or rotary screen printing, or printing using various printers such as an ink jet printer.

The shape of the film-shaped firing material may be appropriately set according to the target shape of sinter bonding, and a circular shape or a rectangular shape is preferable. The circular shape is a shape corresponding to the shape of the semiconductor wafer. The rectangular shape is a shape corresponding to the shape of the chip. The corresponding shape may be the same or approximately the same as the target shape of sinter bonding.

In a case where the film-shaped firing material is a circular shape, the area of the circle may be in a range of 3.5 to 1600 cm² or may be in a range of 85 to 1400 cm². In a case where the film-shaped firing material is a rectangular shape, the area of the rectangle may be in a range of 0.01 to 25 cm² or may be in a range of 0.25 to 9 cm². Particularly, the film-shaped firing material having a desired shape is likely to be formed in a case where the firing material composition is printed.

The condition for drying the firing material composition is not particularly limited, but it is preferable that the firing material composition be dried by being heated in a case where the firing material composition contains a solvent. In this case, it is preferable that the firing material composition be dried, for example, in a temperature range of 70° C. to 250° C. or in a temperature range of 80° C. to 180° C. for 10 seconds to 10 minutes.

The film-shaped firing material according to the present embodiment is a film-shaped firing material containing sinterable metal particles and a binder component, in which the content of the sinterable metal particles is in a range of 15% to 98% by mass, the content of the binder component is in a range of 2% to 50% by mass, the tensile elasticity of the film-shaped firing material at 60° C. is in a range of 4.0 to 10.0 MPa, and the breaking elongation thereof at 60° C. is 500% or greater. Further, a film-shaped firing material containing at least one selected from the group consisting of silver, copper, and oxides thereof as the sinterable metal particles, and a copolymer of a (meth)acrylate compound and another copolymer as the binder component is preferable.

Further, the content of the sinterable metal particles in the film-shaped firing material according to the present embodiment is in a range of 20% to 80% by mass, and the content of the binder component therein is preferably in a range of 5% to 20% by mass.

Film-Shaped Firing Material with a Support Sheet

First Embodiment

A film-shaped firing material with a support sheet according to the present embodiment includes the above-described film-shaped firing material and a support sheet provided on at least one side (surface) of the film-shaped firing material. The support sheet is formed such that a pressure-sensitive adhesive layer is provided on the entire surface or the outer peripheral portion of a base film, and it is preferable that the film-shaped firing material be provided on the pressure-sensitive adhesive layer. The film-shaped firing material may be provided by being brought into direct contact with the pressure-sensitive adhesive layer or provided by being brought into direct contact with the base film. By employing the present form, the material can be used as a dicing sheet used at the time of dividing a semiconductor wafer into chips. Further, the film-shaped firing material having the same shape as the shape of chip can be processed by being divided together with the semiconductor wafer using a blade or the like, and a chip with the film-shaped firing material can be produced.

Figure 2:
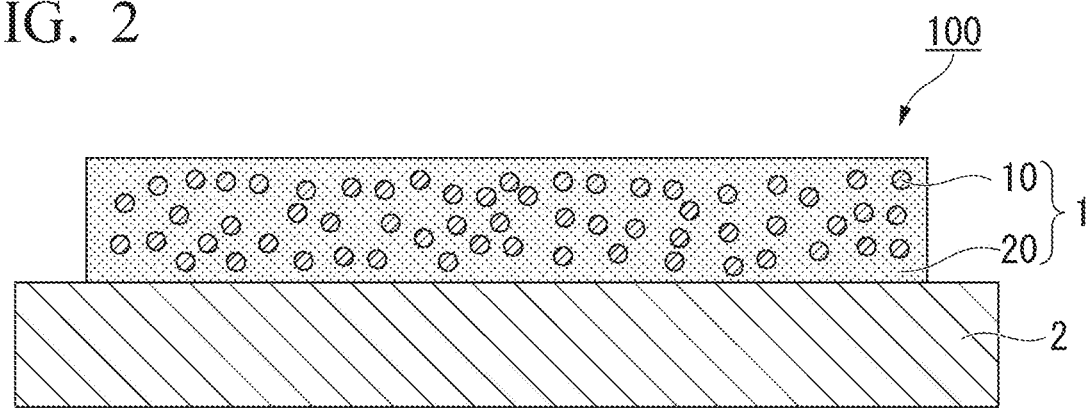
FIG. 2 is a cross-sectional view schematically illustrating a film-shaped firing material with a support sheet according to an embodiment of the present invention.
Figure 3:
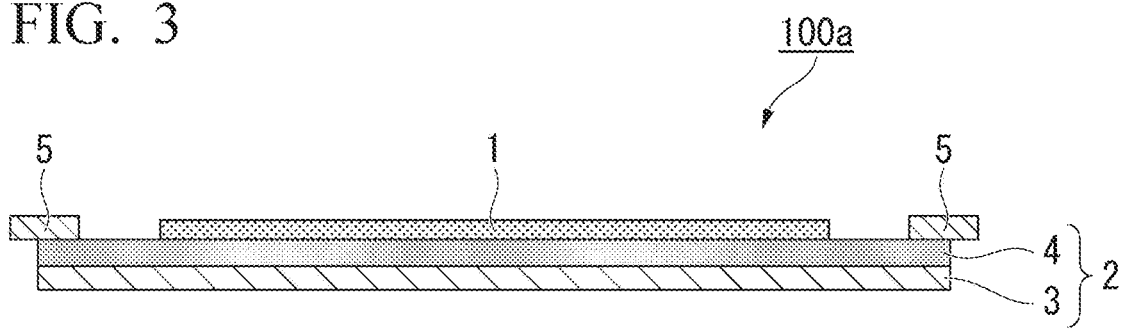
FIG. 3 is a cross-sectional view schematically illustrating a state in which a film-shaped firing material with a support sheet according to an embodiment of the present invention is attached to a ring frame.
Figure 4:
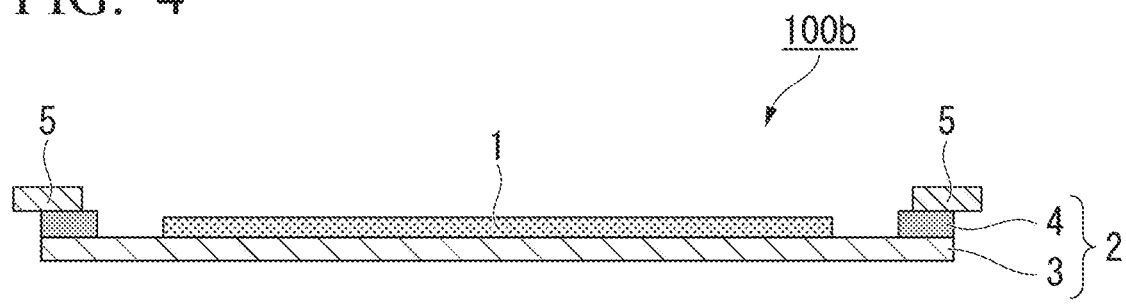
FIG. 4 is a cross-sectional view schematically illustrating a state in which a film-shaped firing material with a support sheet according to an embodiment of the present invention is attached to a ring frame.

Hereinafter, an embodiment of the film-shaped firing material with a support sheet will be described. FIG. 2 is a cross-sectional view schematically illustrating the film-shaped firing material with a support sheet according to the present embodiment. FIGS. 3 and 4 are cross-sectional views schematically illustrating the film-shaped firing material with a support sheet according to the present embodiment. As illustrated in FIG. 2, a film-shaped firing material with a support sheet 100 is formed such that a film-shaped firing material 1 is temporarily and peelably attached to a support sheet 2. As illustrated in FIGS. 3 and 4, film-shaped firing material with a support sheets 100a and 100b according to the present embodiment are formed such that the film-shaped firing material 1 is temporarily and peelably attached to the inner peripheral portion of a support sheet 2 having a pressure-sensitive adhesive portion on the outer peripheral portion. As illustrated in FIG. 3, the support sheet 2 is a pressure-sensitive adhesive sheet having a pressure-sensitive adhesive layer 4 on the upper surface of a base film 3, and the surface of the inner peripheral portion of the pressure-sensitive adhesive layer 4 is covered with the film-shaped firing material to expose the pressure-sensitive adhesive portion to the outer peripheral portion. Further, as illustrated in FIG. 4, the support sheet 2 may include a ring-shaped pressure-sensitive adhesive layer 4 on the outer peripheral portion of the base film 3.

The film-shaped firing material 1 is formed in approximately the same shape as the shape of a workpiece (a semiconductor wafer or the like) to be attached to the inner peripheral portion of the support sheet 2. The support sheet 2 has a pressure-sensitive adhesive portion on the outer peripheral portion. According to a preferable aspect, the film-shaped firing material 1 having a diameter smaller than the diameter of the support sheet 2 is concentrically laminated on the circular support sheet 2. The pressure-sensitive adhesive portion on the outer peripheral portion is used for fixing a ring frame 5 as illustrated in the figure.

(Base Film)

The base film 3 is not particularly limited, and examples thereof include films formed of low density polyethylene (LDPE), linear low density polyethylene (LLDPE), an ethylene-propylene copolymer, polypropylene, polybutene, polybutadiene, polymethylpentene, an ethylene-vinyl acetate copolymer, an ethylene-(meth)acrylic acid copolymer, an ethylene-methyl (meth)acrylate copolymer, an ethylene-ethyl (meth)acrylate copolymer, polyvinyl chloride, a vinyl chloride-vinyl acetate copolymer, a polyurethane film, and an ionomer. In the present specification, "(meth)acryl" includes both acryl and methacryl.

Further, in a case where the support sheet is required to have high heat resistance, examples of the base film 3 include a polyester film such as polyethylene terephthalate, polybutylene terephthalate, or polyethylene naphthalate, and a polyolefin film such as polypropylene or polymethyl pentene. In addition, crosslinked films of these or modified films using radiation, electric discharge, and the like can also be used. The base film may be a laminate of the above-described films.

Further, these films can be used by laminating two or more films thereof or by combining the films. Further, films obtained by coloring these films or performing printing thereon can also be used. Further, the films may be formed into a sheet by performing extrusion molding a thermoplastic resin or may be stretched. Further, films formed into a sheet by thinning and curing a curable resin through predetermined means may be used.

The thickness of the base film is not particularly limited, but is preferably in a range of 30 to 300 μm and more preferably in a range of 50 to 200 μm. By setting the thickness of the base film to be in the above-described range, rupture of the base film is unlikely to occur even in a case where cutting is performed by means of dicing. Further, since the flexibility is sufficiently imparted to the film-shaped firing material with a support sheet, the film-shaped firing material exhibits satisfactory adhesiveness to a workpiece (for example, a semiconductor wafer).

The base film can be obtained by coating the surface with a release agent and performing a peeling treatment. As the release agent used for the peeling treatment, an alkyd-based release agent, a silicone-based release agent, a fluorine-based release agent, an unsaturated polyester-based release agent, a polyolefin-based release agent, or a wax-based release agent is used. Among these, from the viewpoint of heat resistance, an alkyd-based release agent, a silicone-based release agent, or a fluorine-based release agent is particularly preferable.

In order to perform the peeling treatment on the surface of the base film using the release agent, the surface thereof is coated with the release agent in the absence of a solvent or after being diluted with a solvent or emulsified, using a gravure coater, a Meyer bar coater, an air knife coater, or a roll coater, and the base film coated with the release agent is provided at room temperature or under a heating condition or may be cured by electron beams to form a laminate through wet lamination, dry lamination, hot melt lamination, melt extrusion lamination, or coextrusion process.

(Pressure-Sensitive Adhesive Layer)

The support sheet 2 has a pressure-sensitive adhesive portion on at least the outer peripheral portion thereof. It is preferable that the pressure-sensitive adhesive portion have a function of temporarily fixing the ring frame 5 on the outer peripheral portions of film-shaped firing material with a support sheet 100*a* and 100*b*, and the ring frame 5 is peelable after required steps are carried out. Therefore, as the pressure-sensitive adhesive layer 4, a layer with low tackiness may be used, or an energy ray-curable layer having an adhesive force which is decreased at the time of irradiation with energy rays may be used. A repeelable pressure-sensitive adhesive layer can be formed using various known pressure-sensitive adhesives (for example, a general purpose pressure-sensitive adhesive such as a rubber-based pressure-sensitive adhesive, an acrylic pressure-sensitive adhesive, a silicone-based pressure-sensitive adhesive, a urethane-based pressure-sensitive adhesive, or a vinyl ether-based pressure-sensitive adhesive, a pressure-sensitive adhesive with surface unevenness, an energy ray-curable pressure-sensitive adhesive, or a thermal expansion component-containing pressure-sensitive adhesive).

The support sheet 2 is a pressure-sensitive adhesive sheet having a typical configuration provided with the pressure-sensitive adhesive layer 4 on the entire upper surface of the base film 3 as illustrated in FIG. 3. Alternatively, the support sheet may have a configuration in which the surface of the pressure-sensitive adhesive layer 4 on the inner peripheral portion is covered with the film-shaped firing material and the pressure-sensitive adhesive portion is exposed to the outer peripheral portion. In this case, the outer peripheral portion of the pressure-sensitive adhesive layer 4 is used for fixing the above-described ring frame 5, and the film-shaped firing material is peelably laminated on the inner peripheral portion. As the pressure-sensitive adhesive layer 4, a layer with low tackiness may be used in the same manner as described above, or an energy ray-curable pressure-sensitive adhesive may be used.

In the configuration illustrated in FIG. 4, the ring-shaped pressure-sensitive adhesive layer 4 is formed on the outer peripheral portion of the base film 3 and is set as a pressure-sensitive adhesive portion. At this time, the pressure-sensitive adhesive layer 4 may be a single pressure-sensitive adhesive layer formed of the above-described pressure-sensitive adhesive or may be obtained by circularly cutting double-sided pressure-sensitive adhesive tape containing a pressure-sensitive adhesive layer formed of the above-described pressure-sensitive adhesive.

As a weak pressure-sensitive adhesive, an acrylic pressure-sensitive adhesive or a silicone-based pressure-sensitive adhesive is preferably used. Further, in consideration of the peelability of the film-shaped firing material, the adhesive force of the pressure-sensitive adhesive layer 4 on a SUS plate at 23° C. is acquired in conformity with JIS Z 0237:2009 and is preferably in a range of 30 to 120 mN/25 mm, more preferably in a range of 50 to 100 mN/25 mm, and still more preferably in a range of 60 to 90 mN/25 mm. In a case where the adhesive force is extremely low, the ring frame may drop off. Further, in a case where the adhesive force is extremely high, the pressure-sensitive adhesive layer 4 is unlikely to be peeled off from the ring frame, and thus the ring frame is unlikely to be reused.

In a case where a repeelable pressure-sensitive adhesive layer which is curable by energy rays is used in the support sheet with the configuration of FIG. 3, the tackiness may be decreased by irradiating a region where the film-shaped firing material is laminated with energy rays in advance. At this time, the adhesive force in other regions may be maintained to be high without performing irradiation with energy rays for the purpose of bonding the ring frame 5. In order to not irradiate other regions with energy rays, for example, irradiation with energy rays may be performed from the base film side by providing an energy ray shielding layer in regions corresponding to other regions of the base film through printing or the like. In the support sheet with the configuration of FIG. 3, the surface where the pressure-sensitive adhesive layer 4 of the base film 3 is provided can be subjected to a roughening treatment such as sand blasting or a solvent treatment or an oxidation treatment such as a corona discharge treatment, irradiation with electron beams, a plasma treatment, an ozone ultraviolet irradiation treatment, a flame treatment, a chromic acid treatment or an hot air treatment as desired, for the purpose of strengthening bonding between the base film 3 and the pressure-sensitive adhesive layer 4. In addition, a primer treatment can be performed.

The thickness of the pressure-sensitive adhesive layer 4 is not particularly limited, but is preferably in a range of 1 to 100 μm, more preferably in a range of 2 to 80 μm, and particularly preferably in a range of 3 to 50 μm.

(Film-Shaped Firing Material with a Support Sheet)

The film-shaped firing material with a support sheet is formed such that the film-shaped firing material is temporarily and peelably attached to the inner peripheral portion of a support sheet having a pressure-sensitive adhesive portion on the outer peripheral portion. In the configuration example illustrated in FIG. 3, the film-shaped firing material with a support sheet 100*a* is formed such that the film-shaped firing material 1 is peelably laminated on the inner peripheral portion of the support sheet 2 formed of the base film 3 and the pressure-sensitive adhesive layer 4, and the pressure-sensitive adhesive layer 4 is exposed to the outer peripheral portion of the support sheet 2. In this configuration example, it is preferable that the film-shaped firing material 1 having a diameter smaller than the diameter of the support sheet 2 be concentrically and peelably laminated on the pressure-sensitive adhesive layer 4 of the support sheet 2.

The film-shaped firing material with a support sheet 100*a* having the above-described configuration is attached to the ring frame 5 in the pressure-sensitive adhesive layer 4 exposed to the outer peripheral portion of the support sheet 2.

Further, cyclic double-sided tape or a pressure-sensitive adhesive layer may be separately provided on the paste (the pressure-sensitive adhesive layer exposed to the outer peripheral portion of the pressure-sensitive adhesive sheet) with respect to the ring frame. The double-sided tape has a configuration of a pressure-sensitive adhesive layer, a core material, and a pressure-sensitive adhesive layer, and the pressure-sensitive adhesive layer in the double-sided tape is not particularly limited, and a pressure-sensitive adhesive such as a rubber-based pressure-sensitive adhesive, an acrylic pressure-sensitive adhesive, a silicone-based pressure-sensitive adhesive, or polyvinyl ether is used. The pressure-sensitive adhesive layer is attached to the ring frame on the outer peripheral portion at the time of production of a substrate with a chip described below. Preferred examples of the core material of the double-sided tape include a polyester film, a polypropylene film, a polycarbonate film, a polyimide film, a fluorine resin film, and a liquid crystal polymer film.

Figure 5:
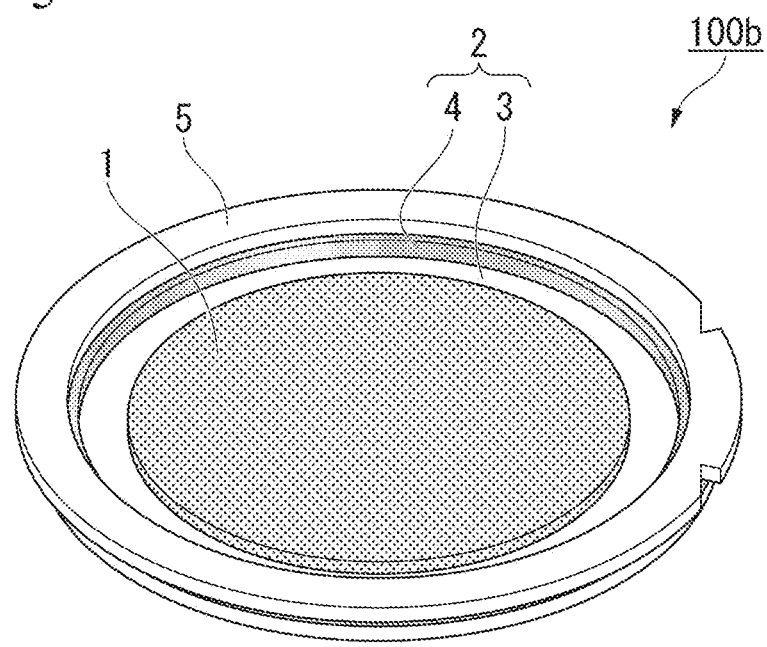
FIG. 5 is a perspective view schematically illustrating a state in which a film-shaped firing material with a support sheet according to an embodiment of the present invention is attached to a ring frame.

In the configuration example illustrated in FIG. 4, the ring-shaped pressure-sensitive adhesive layer 4 is formed on the outer peripheral portion of the base film 3 and is set as a pressure-sensitive adhesive portion. FIG. 5 is a perspective view illustrating the film-shaped firing material with a support sheet 100b illustrated in FIG. 4. At this time, the pressure-sensitive adhesive layer 4 may be a single pressure-sensitive adhesive layer formed of the pressure-sensitive adhesive or may be obtained by circularly cutting double-sided pressure-sensitive adhesive tape containing a pressure-sensitive adhesive layer formed of the pressure-sensitive adhesive. The film-shaped firing material 1 is peelably laminated on the inner peripheral portion of the base film 3 enclosed by the pressure-sensitive adhesive portion. In this configuration example, it is preferable that the film-shaped firing material 1 having a diameter smaller than the diameter of the support sheet 2 be concentrically and peelably laminated on the base film 3 of the support sheet 2.

A release film may be provided on the film-shaped firing material with a support sheet for the purpose of surface protection in order to avoid contact of any one or both surfaces of the film-shaped firing material and the pressure-sensitive adhesive portion with the outside until the material is provided for use.

The surface protective film (release film) can be obtained by performing the above-described peeling treatment on the surface of the base film such as polyethylene, polyethylene terephthalate, polybutylene terephthalate, polyethylene naphthalate, or polypropylene using a release agent. Examples of the release agent used for the peeling treatment include the release agents exemplified in the section of the base film.

The thickness of the film-shaped firing material with a support sheet is preferably in a range of 1 to 500 μm, more preferably in a range of 5 to 300 μm, and still more preferably in a range of 10 to 150 μm.

Here, the "thickness of the film-shaped firing material with a support sheet" indicates the thickness of the entire film-shaped firing material with a support sheet. For example, the thickness of the film-shaped firing material with a support sheet formed of a plurality of layers indicates the total thickness of all layers constituting the film-shaped firing material with a support sheet.

Second Embodiment

Figure 6:
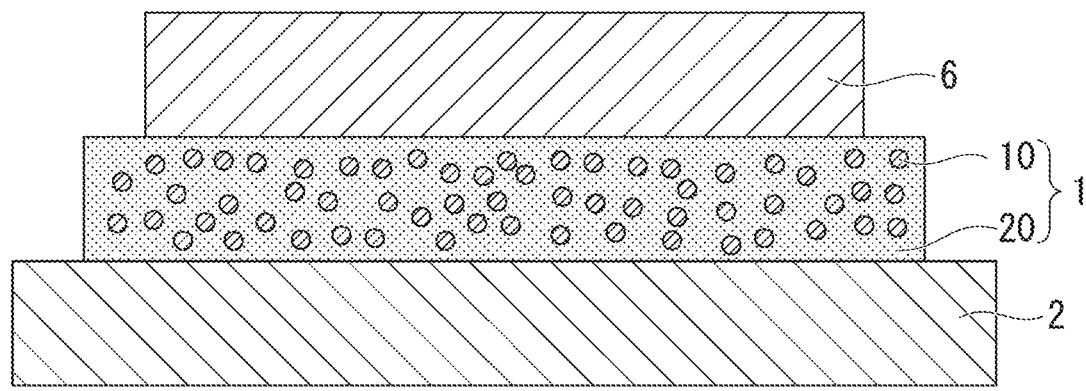
FIG. 6 is a cross-sectional view schematically illustrating a state in which a film-shaped firing material with a support sheet according to an embodiment of the present invention is laminated on a semiconductor wafer.

A film-shaped firing material with a support sheet of the present embodiment includes a film-shaped firing material and a support sheet which is provided on at least one side (surface) of the film-shaped firing material, in which an adhesive force (a2) of the film-shaped firing material to the support sheet is smaller than an adhesive force (a1) of the film-shaped firing material to a semiconductor wafer, the adhesive force (a1) is 0.1 N/25 mm or greater, and the adhesive force (a2) is in a range of 0.1 N/25 mm to 0.5 N/25 mm. For example, in a laminate formed by laminating the film-shaped firing material with a support sheet according to the present embodiment and the semiconductor wafer illustrated in FIG. 6, the adhesive force (a2) of the film-shaped firing material to the support sheet is smaller than the adhesive force (a1) of the film-shaped firing material to the semiconductor wafer, the adhesive force (a1) is 0.1 N/25 mm or greater, and the adhesive force (a2) is in a range of 0.1 N/25 mm to 0.5 N/25 mm.

<Adhesive Force>

In the film-shaped firing material with a support sheet according to the present embodiment, the adhesive force (a1) of the film-shaped firing material to the semiconductor wafer is 0.1 N/25 mm or greater, preferably 0.5 N/25 mm or greater, and more preferably 1.0 N/25 mm or greater. In a case where the adhesive force (a1) is greater than or equal to the above-described lower limit, chip jump during the dicing can be suppressed. Further, it is possible to prevent the chip position from being shifted while the chip and the substrate are transported in a state of being temporarily fixed by the film-shaped firing material before being fired.

In the film-shaped firing material with a support sheet according to the present embodiment, the adhesive force (a2) of the film-shaped firing material to the support sheet is in a range of 0.1 N/25 mm to 0.5 N/25 mm, preferably in a range of 0.2 N/25 mm to 0.5 N/25 mm, and more preferably in a range of 0.2 N/25 mm to 0.4 N/25 mm. In a case where the adhesive force (a2) is greater than or equal to the above-described lower limit, it is possible to suppress scattering of the firing material during the dicing and to suppress contamination of the semiconductor wafer.

In a case where the adhesive force (a2) is smaller than the adhesive force (a1) and is less than or equal to the above-described upper limit, as described below in detail, the film-shaped firing material is likely to be peeled off from the support sheet at the time of picking up the chips divided by dicing the semiconductor wafer so that the diced chips with the film-shaped firing material can be easily picked up.

The adhesive force (a1) can be measured in conformity with JIS Z 0237:2009, specifically, according to the following method.

First, the surface of the silicon wafer is subjected to a chemical mechanical polishing treatment until the arithmetic average roughness (Ra) reaches 0.02 μm.

The film-shaped firing material with a support sheet is attached to the treated surface of the silicon wafer after the surface protective film such as a release film is removed. During the attachment, the film-shaped firing material with a support sheet may be heated to room temperature or higher. The heating temperature is not particularly limited, but is preferably 120° C. or lower. Next, the support sheet is removed, a polyethylene terephthalate (PET) film is attached to the exposed film-shaped firing material and strongly bonded (lined) thereto, and the film-shaped firing material lined with the PET film is notched and cut to have a width of 25 mm and a length of 100 mm or greater.

Next, the film-shaped firing material lined with the PET film is peeled from the silicon wafer by peeling the entire PET film at a peeling speed of 300 mm/min. The peeling at this time is set as so-called "180° peeling" in which the film-shaped firing material with a support sheet is peeled off in the length direction thereof such that the angle between the surface of the silicon wafer and the surface of the film-shaped firing material with a support sheet which are in contact with each other reaches 180°. Further, the load (peeling force) during this 180° peeling is measured, and the measured value is set as the adhesive force (a1) (N/25 mm).

Further, the film-shaped firing material which is strongly bonded to the PET film can be prepared by coating the PET film with the firing material composition containing a solvent and drying the composition so that the solvent is volatilized. Further, a test piece for measuring the adhesive force (a1) can be prepared by cutting the PET film such that the width thereof is set to 25 mm and the length thereof is set to 100 mm or greater and attaching the film-shaped firing material which is strongly bonded to the cut PET film to the treated surface of the silicon wafer.

The adhesive force (a2) can be measured in conformity with JIS Z 0237:2009, specifically, according to the following method.

After the surface protective film such as a release film is removed from the film-shaped firing material with a support sheet, a polyethylene terephthalate (PET) film is attached to the exposed film-shaped firing material and strongly bonded (lined) thereto and the film-shaped firing material with a support sheet is cut to have a width of 25 mm and a length of 100 mm or greater. Next, the film-shaped firing material lined with the PET film is peeled from the film-shaped firing material with a support sheet lined with the cut PET film by peeling the entire PET film at a peeling speed of 300 mm/min. The peeling at this time is set as so-called "180° peeling" in which the film-shaped firing material is peeled off in the length direction thereof such that the angle between the surface of the support sheet and the surface of the film-shaped firing material which are in contact with each other reaches 180°. Further, the load (peeling force) during this 180° peeling is measured, and the measured value is set as the adhesive force (a2) (N/25 mm).

Further, the film-shaped firing material which is strongly bonded to the PET film can be prepared by coating the PET film with the firing material composition containing a solvent and drying the composition so that the solvent is volatilized. Further, a test piece for measuring the adhesive force (a2) can be prepared by cutting the PET film such that the width thereof is set to 25 mm and the length thereof is set to 100 mm or greater and attaching the film-shaped firing material which is strongly bonded to the cut PET film to the support sheet.

As illustrated in FIG. 2, the film-shaped firing material with a support sheet 100 according to the present embodiment is formed such that the film-shaped firing material 1 is temporarily and peelably attached to the support sheet 2. The support sheet is formed such that a pressure-sensitive adhesive layer is provided on the entire surface or the outer peripheral portion of a base film, and it is preferable that the film-shaped firing material be provided on the pressure-sensitive adhesive layer. The film-shaped firing material may be provided by being brought into direct contact with the pressure-sensitive adhesive layer or provided by being brought into direct contact with the base film. By employing the present form, the material can be used as a dicing sheet used at the time of dividing a semiconductor wafer into chips. Further, the film-shaped firing material having the same shape as the shape of chip can be processed by being divided together with the semiconductor wafer using a blade or the like, and a chip with the film-shaped firing material can be produced.

Hereinafter, an embodiment of the film-shaped firing material with a support sheet according to the present embodiment will be described. Further, the description of the film-shaped firing material with a support sheet according to the second embodiment which is the same as the description of the film-shaped firing material with a support sheet according to the first embodiment will not be repeated.

<Film-Shaped Firing Material>
<Composition>

The film-shaped firing material with a support sheet 1 contains the sinterable metal particles 10 and the binder component 20 as illustrated in FIG. 2. The film-shaped firing material in the film-shaped firing material with a support sheet according to the present embodiment may be formed of the sinterable metal particles, the binder component, and other additives described above, and the total content (% by mass) of these is 100% by mass.

In a case where the film-shaped firing material contains the non-sinterable metal particles, the film-shaped firing material may be formed of the sinterable metal particles, the non-sinterable metal particles, the binder component, and other additives described above, and the total content (% by mass) of these is 100% by mass.

The content of the sinterable metal particles in the film-shaped firing material is in a range of 15% to 98% by mass, more preferably in a range of 15% to 90% by mass, and still more preferably in a range of 20% to 80% by mass with respect to the total mass (100% by mass) of all components other than the solvent (hereinafter, also noted as the "solid content"). In a case where the content of the sinterable metal particles is less than or equal to the above-described upper limit, the content of the binder component can be sufficiently ensured, and thus the film shape can be maintained. Meanwhile, in a case where the content of the sinterable metal particles is greater than or equal to the lower limit, the sinterable metal particles or the sinterable metal particles and the non-sinterable metal particles are fused at the time of being fired so that high bonding adhesive strength (shear adhesive force) is exhibited after the particles are fired.

In a case where the film-shaped firing material contains the non-sinterable metal particles, the total content of the sinterable metal particles and the non-sinterable metal particles is preferably in a range of 50% to 98% by mass, more preferably in a range of 70% to 95% by mass, and still more preferably in a range of 80% to 95% by mass with respect to the total mass (100% by mass) of the solid content in the film-shaped firing material.

The content of the binder component is in a range of 2% to 50% by mass, preferably in a range of 5% to 30% by mass, and more preferably in a range of 5% to 20% by mass with respect to the total mass (100% by mass) of the solid content in the film-shaped firing material. In a case where the content of the binder component is less than or equal to the above-described upper limit, the content of the sinterable metal particles can be sufficiently ensured, and thus the bonding adhesive force between the film-shaped firing material and the adherend is improved. In a case where the content of the binder component is greater than or equal to the above-described lower limit, the film shape is likely to be maintained.

The mass ratio (sinterable metal particles:binder component) of the sinterable metal particles to the binder component in the film-shaped firing material is preferably in a range of 50:1 to 1:5, more preferably in a range of 20:1 to 1:2, and still more preferably in a range of 10:1 to 1:1. In a case where the film-shaped firing material contains the non-sinterable metal particles, the mass ratio ((sinterable metal particles+non-sinterable metal particles):binder component) of the sinterable metal particles and the non-sinterable metal particles to the binder component is preferably in a range of 50:1 to 1:1, more preferably in a range of 20:1 to 2:1, and still more preferably in a range of 9:1 to 4:1.

The film-shaped firing material may contain a high-boiling-point solvent used at the time of mixing the sinterable metal particles, the non-sinterable metal particles, the binder component, and other additive components. The content of the high-boiling-point solvent is preferably 20% by mass or less, more preferably 15% by mass or less, and still more preferably 10% by mass or less with respect to the total mass (100% by mass) of the film-shaped firing material.

<Tensile Elasticity>

The tensile elasticity of the film-shaped firing material according to the present embodiment at 60° C. is preferably in a range of 4.0 to 10.0 MPa and more preferably in a range of 4.5 to 5.5 MPa. The tensile elasticity of the film-shaped firing material according to the present embodiment at 23° C. is preferably in a range of 5.0 to 20.0 MPa and more preferably in a range of 6.0 to 18.0 MPa. In a case where the tensile elasticity of the film-shaped firing material at 60° C. or 23° C. is in the above-described range, the amount of the film-shaped firing material to be deformed due to the external force is small, and an effect in which the material has toughness is also obtained. Particularly in a case where the tensile elasticity thereof is less than or equal to the above-described upper limit, the film-shaped firing material is unlikely to become brittle, and the contamination of a wafer during the dicing can be suppressed. Meanwhile, in a case where the tensile elasticity thereof is greater than or equal to the above-described lower limit, the film-shaped firing material is not extremely softened so that an effect in which chipping during the dicing can be suppressed is also obtained.

Further, the reason why the tensile elasticity at 60° C. and the breaking elongation described below in the present embodiment are specified is that the film-shaped firing material is heated to approximately 60° C. due to the frictional heat during the dicing using a blade, but the temperature of the film-shaped firing material during actual dicing is not limited to 60° C. Further, the reason why the tensile elasticity at 23° C. and the breaking elongation described below in the present embodiment are specified is that the measurement at 23° C. is easily performed, but this does not mean that the temperature of the film-shaped firing material during the actual dicing is 23° C.

The tensile elasticity of the film-shaped firing material at 23° C. or 60° C. can be measured according to the above-described method.

<Breaking Elongation>

The breaking elongation of the film-shaped firing material according to the present embodiment at 60° C. is preferably 500% or greater and more preferably 600% or greater. The breaking elongation of the film-shaped firing material according to the present embodiment at 23° C. is preferably 300% or greater and more preferably 400% or greater. In a case where the breaking elongation thereof at 60° C. or 23° C. is greater than or equal to the above-described lower limit, the film-shaped firing material is unlikely to become brittle, and the contamination of a wafer during the dicing can be suppressed. The breaking elongation of the film-shaped firing material at 60° C. is preferably 3000% or less, and the breaking elongation thereof at 23° C. is preferably 2500% or less.

The breaking elongation of the film-shaped firing material at 23° C. or 60° C. can be measured according to the above-described method.

According to the film-shaped firing material, since the adhesive force (a1) of the film-shaped firing material to the semiconductor wafer is 0.1 N/25 mm or greater, it is possible to suppress chip jump during the dicing and to prevent the chip position from being shifted while the chip and the substrate are transported in a state of being temporarily fixed by the film-shaped firing material before being fired. Further, according to the film-shaped firing material, since the adhesive force (a2) of the film-shaped firing material to the support sheet is 0.1 N/25 mm or greater, it is possible to suppress scattering of the firing material during the dicing and to suppress contamination of the semiconductor wafer.

Further, according to the film-shaped firing material, since the adhesive force (a2) is smaller than the adhesive force (a1) and the adhesive force (a2) is 0.5 N/25 mm or less, the film-shaped firing material is likely to be peeled off from the support sheet at the time of picking up the chips divided by dicing the semiconductor wafer so that the diced chips with the film-shaped firing material can be easily picked up.

According to the film-shaped firing material of the present embodiment, the thickness stability is excellent because the material is in the form of a film. Further, since the film-shaped firing material according to the present embodiment contains sinterable metal particles, the thermal conductivity is excellent. Further, the film-shaped firing material according to the present embodiment contains preferably 15% to 98% by mass of the sinterable metal particles and 2% to 50% by mass of the binder component. Further, the tensile elasticity of the film-shaped firing material at 60° C. is preferably in a range of 4.0 to 10.0 MPa, and the breaking elongation thereof at 60° C. is preferably 500% or greater. Since such a film-shaped firing material has more moderate hardness and toughness, chips vibrate due to the friction of a blade during the dicing, and shavings of the film-shaped firing material are unlikely to be generated. Therefore, chipping and contamination of a wafer can be suppressed, and the dicing suitability is excellent.

The method of producing the film-shaped firing material according to the second embodiment is the same as the method of producing the film-shaped firing material according to the first embodiment, and thus the description thereof will not be repeated.

<<Method of Producing Film-Shaped Firing Material with a Support Sheet>>

The film-shaped firing material with a support sheet can be produced by sequentially laminating the above-described respective layers so as to have the corresponding positional relationship.

For example, in a case where the pressure-sensitive adhesive layer or the film-shaped firing material is laminated on the base film, the release film is coated or printed with the pressure-sensitive adhesive composition or firing material composition containing a component and a solvent for constituting the pressure-sensitive adhesive layer or the film-shaped firing material, the composition is dried as necessary to volatilize the solvent and obtain a film shape, the pressure-sensitive adhesive layer or the film-shaped firing material is formed on the release film in advance, and the surface of the base film is attached to the surface of the pressure-sensitive adhesive layer or film-shaped firing material after completion of the above-described formation on a side opposite to a side where the release film is provided. At this time, it is preferable that the surface of the release film on which the peeling treatment has been performed be coated or printed with the pressure-sensitive adhesive composition or firing material composition. The release film may be removed after formation of the laminated structure as necessary.

For example, in a case where a film-shaped firing material with a support sheet (a film-shaped firing material with a support sheet, in which the support sheet is a laminate of the base film and the pressure-sensitive adhesive layer) formed by laminating the pressure-sensitive adhesive layer on the base film and laminating the film-shaped firing material on the pressure-sensitive adhesive layer is produced, the pressure-sensitive adhesive layer is laminated on the base film according to the above-described method, the release film is separately coated or printed with the firing material composition containing a component and a solvent for constituting the film-shaped firing material, the composition is dried as necessary to volatilize the solvent and obtain a film shape so that the film-shaped firing material is formed on the release film, the exposed surface of this film-shaped firing material is attached to the exposed surface of the pressure-sensitive adhesive layer after being laminated on the base material, and the film-shaped firing material is laminated on the pressure-sensitive adhesive layer, thereby obtaining a film-shaped firing material with a support sheet. Even in a case where the film-shaped firing material is formed on the release film, it is preferable that the surface of the release film on which the peeling treatment has been performed be coated or printed with the firing material composition, and the release film may be removed after formation of the laminated structure as necessary.

As described above, since all layers other than the base material constituting the film-shaped firing material with a support sheet can be formed on the release film in advance and laminated using a method of bonding the layers to the surface of a target layer, the film-shaped firing material with a support sheet may be produced by appropriately selecting a layer that employs such a step as necessary.

Further, the film-shaped firing material with a support sheet may be stored in a state in which all the required layers are provided and then the release film is attached to the surface of the outermost layer on a side opposite to the support sheet.

<<Method of Producing Substrate with Chip>>

Next, a method of utilizing the film-shaped firing material with a support sheet according to the present invention will be described based on an example of a case where the firing material is used for production of a substrate with a chip.

According to the embodiment of the present invention, the method of producing a substrate with a chip obtained by using the film-shaped firing material with a support sheet is performed by peeling the release film off from the film-shaped firing material with a support sheet and attaching the film-shaped firing material with a support sheet to the rear surface of a semiconductor wafer (workpiece). The following steps (1) and (2) may be performed in order of the step (1) and the step (2), and the following steps (1) to (4) may be performed in order of the step (1), the step (2), the step (3), and the step (4).

Step (1): a step of dicing the semiconductor wafer (workpiece) and the film-shaped firing material of the laminate formed by sequentially laminating the support sheet, the film-shaped firing material, and the semiconductor wafer (workpiece);

Step (2): a step of peeling the support sheet off from the film-shaped firing material to obtain a chip with the film-shaped firing material;

Step (3): a step of attaching the chip with the film-shaped firing material to the surface of a substrate; and Step (4): a step of firing the film-shaped firing material and bonding the chip and the substrate Hereinafter, a case of performing the steps (1) to (4) will be described.

The semiconductor wafer may be a silicon wafer or a silicon carbide wafer or may be a compound semiconductor wafer such as gallium arsenic. A circuit may be formed on the surface of the semiconductor wafer. The circuit on the wafer surface can be formed according to various methods which have been commonly used in the related art such as an etching method and a lift-off method. Next, a surface (rear surface) of the semiconductor wafer opposite to the circuit surface is ground. The grinding method is not particularly limited, and the surface is ground by known means using a grinder. At the time of grinding the rear surface, a pressure-sensitive adhesive sheet which is referred to as a surface-protective sheet is attached to the circuit surface for the purpose of protecting the circuit on the surface. The grinding of the rear surface is carried out by fixing the circuit surface side (that is, the surface-protective sheet side) of the wafer using a chuck table or the like and grinding the rear surface side where the circuit is not formed using a grinder. The thickness of the wafer after being ground is not particularly limited, but is typically in a range of 20 to 500 μm. Next, a fractured layer generated during the grinding of the rear surface is removed as necessary. The fractured layer is removed by performing chemical etching, plasma etching, or the like.

Next, the film-shaped firing material of the film-shaped firing material with a support sheet is attached to the rear surface of the semiconductor wafer. Thereafter, the steps (1) to (4) are performed in order of the step (1), the step (2), the step (3), and the step (4).

The laminate of the semiconductor wafer, the film-shaped firing material, and the support sheet is diced for each circuit formed on the surface of the wafer to obtain a laminate of the chip, the film-shaped firing material, and the support sheet. The dicing is performed by cutting the semiconductor wafer and the film-shaped firing material simultaneously. According to the film-shaped firing material with a support sheet according to the present embodiment, since the adhesive force is exhibited between the film-shaped firing material and the support sheet during the dicing, chipping and chip jump can be prevented. Therefore, the dicing adaptability is excellent. The dicing is not particularly limited, and a method of fixing the peripheral portion (an outer peripheral portion of a support) of the support sheet with the ring frame at the time of dicing the semiconductor wafer and dividing the semiconductor wafer according to a known technique of using a rotary round blade such as a dicing blade is an exemplary example of the dicing method. The film-shaped firing material may be completely cut, and the cut depth of the support sheet resulting from dicing is preferably in a range of 0 to 30 μm from the interface between the film-shaped firing material and the support sheet. By decreasing the amount of the support sheet to be cut, it is possible to suppress fusing of the pressure-sensitive adhesive layer or the base film constituting the support sheet caused by the friction of the dicing blade or generation of burrs and the like. Further, according to the film-shaped firing material with a support sheet of the present embodiment, shavings of the film-shaped firing material are unlikely to be generated. Therefore, contamination of the wafer can be suppressed.

Further, particularly a chip obtained by dividing the semiconductor wafer having a surface on which a circuit is formed is also referred to as an element or a semiconductor element.

Thereafter, the support sheet may be expanded. In a case where a base film having excellent extensibility is selected as the base film of the support sheet, the support sheet has excellent expandability. By picking up the diced chips with the film-shaped firing material by general means such as a collet, the film-shaped firing material and the support sheet are peeled from each other. As a result, a chip (a chip with the film-shaped firing material) having a film-shaped firing material on the rear surface is obtained.

Next, the chip with the film-shaped firing material is attached to the surface of the substrate. The substrate includes a lead frame, a heat sink, and the like.

Next, the film-shaped firing material is fired so that the substrate and the chip are sinter-bonded. At this time, in a case where the exposed surface of the film-shaped firing material of the chip with the film-shaped firing material is attached to the substrate, the chip and the substrate can be sinter-bonded through the film-shaped firing material.

The heating temperature of firing the film-shaped firing material may be appropriately determined in consideration of the kind and the like of the film-shaped firing material, but is preferably in a range of 100° C. to 600° C., more preferably in a range of 150° C. to 550° C., and still more preferably in a range of 250° C. to 500° C. The heating time may be appropriately determined in consideration of the kind and the like of the film-shaped firing material, but is preferably in a range of 5 seconds to 60 minutes, more preferably in a range of 5 seconds to 30 minutes, and still more preferably in a range of 10 seconds to 10 minutes.

The film-shaped firing material may be fired by performing pressurizing and firing, in which the film-shaped firing material is fired by being pressurized. The condition for pressurization can be set to be, for example, in a range of 1 to 50 MPa.

According to the method of producing the substrate with a chip of the present embodiment, the film-shaped firing material with a highly uniform thickness can be simply formed on the rear surface of the chip, and cracks after the dicing step or the packing are unlikely to be generated. Further, according to the method of producing the substrate with a chip of the present embodiment, the chip with the film-shaped firing material can be obtained without separately attaching the film-shaped firing material to the rear surface of the divided chip, and thus the production step can be simplified. Further, a substrate with a chip in which the chip and the substrate are sinter-bonded through the film-shaped firing material by disposing the chip with the film-shaped firing material on a desired substrate and firing the substrate and the chip can be produced. The film-shaped firing material of the present invention which is used for the method of producing the substrate with a chip according to the present embodiment has moderate hardness and toughness, chips vibrate due to the friction of a blade during the dicing, and shavings of the film-shaped firing material are unlikely to be generated. Therefore, chipping and contamination of a wafer can be suppressed.

As an embodiment, a chip with the film-shaped firing material which includes a chip and the film-shaped firing material according to the present invention is obtained. As an example, the chip with the film-shaped firing material can be produced according to the method of producing the substrate with a chip described above.

Further, in the above-described embodiment, the example of the sinter bonding between the chip and the substrate of the film-shaped firing material has been described, but the target for the sinter bonding of the film-shaped firing material is not limited to the example described above, and the sinter bonding can be performed on various products sintered in contact with the film-shaped firing material.

Further, according to the above-described embodiment, the film-shaped firing material having the same shape as the shape of chip can be processed by being divided together with the semiconductor wafer using a blade or the like, and a chip with the film-shaped firing material can be produced. That is, in the chip with the film-shaped firing material, the size (area) of the contact surface of the film-shaped firing material is the same as the size of the contact surface of the chip, but these may be different from each other. For example, the substrate and the chip may be attached to each other through the film-shaped firing material in a state in which the contact surface of the film-shaped firing material is larger than the contact surface of the chip. Specifically, the film-shaped firing material having a desired size is disposed on the substrate, and the chip having a contact surface smaller than that of the film-shaped firing material may be attached to the film-shaped firing material.

<<Method of Manufacturing Semiconductor Device>>

Next, a method of using the film-shaped firing material with a support sheet according to the present embodiment will be described based on an example of a case where the firing material is used for manufacturing a semiconductor device. In the present invention, the semiconductor device has the same definition as the substrate with a chip which is produced using the film-shaped firing material according to the present embodiment and can be manufactured using the film-shaped firing material with a support sheet according to the present embodiment.

According to an embodiment of the present invention, the method of manufacturing a semiconductor device using the film-shaped firing material with a support sheet is a method of manufacturing a semiconductor device obtained by using the film-shaped firing material with a support sheet according to the present invention, and the method includes the following steps (1) to (4) which are sequentially performed.

Step (1): a step of dicing the semiconductor wafer (workpiece) and the film-shaped firing material of a laminate which is obtained by attaching the film-shaped firing material with a support sheet to the semiconductor wafer (workpiece) and is formed by sequentially laminating the support sheet, the film-shaped firing material, and the semiconductor wafer (workpiece);

Step (2): a step of peeling the support sheet off from the diced film-shaped firing material to obtain a chip with the film-shaped firing material;

Step (3): a step of attaching the chip with the film-shaped firing material to the surface of the substrate; and Step (4): a step of firing the film-shaped firing material of the chip with the film-shaped firing material and bonding the chip and the substrate to each other Hereinafter, the steps (1) to (4) will be described.

The semiconductor wafer may be a silicon wafer or a silicon carbide wafer or may be a compound semiconductor wafer such as gallium arsenic. A circuit may be formed on the surface of the semiconductor wafer. The circuit on the wafer surface can be formed according to various methods which have been commonly used in the related art such as an etching method and a lift-off method. Next, a surface (rear surface) of the semiconductor wafer opposite to the circuit surface is ground. The grinding method is not particularly limited, and the surface is ground by known means using a grinder. At the time of grinding the rear surface, a pressure-sensitive adhesive sheet which is referred to as a surface-protective sheet is attached to the circuit surface for the purpose of protecting the circuit on the surface. The grinding of the rear surface is carried out by fixing the circuit surface side (that is, the surface-protective sheet side) of the wafer using a chuck table or the like and grinding the rear surface side where the circuit is not formed using a grinder. The thickness of the wafer after being ground is not particularly limited, but is typically in a range of 20 to 500 µm. Next, a fractured layer generated during the grinding of the rear surface is removed as necessary. The fractured layer is removed by performing chemical etching, plasma etching, or the like.

Next, the film-shaped firing material of the film-shaped firing material with a support sheet is attached to the rear surface of the semiconductor wafer. The obtained laminate of the semiconductor wafer, the film-shaped firing material, and the support sheet is diced for each circuit formed on the surface of the wafer to obtain a laminate of the chip, the film-shaped firing material, and the support sheet. The dicing is performed by cutting the semiconductor wafer and the film-shaped firing material simultaneously. According to the film-shaped firing material with a support sheet according to the present embodiment, the adhesive force (a1) of the film-shaped firing material to the semiconductor wafer is 0.1 N/25 mm or greater, and the adhesive force (a2) of the film-shaped firing material to the support sheet is 0.1 N/25 mm or greater, the adhesive force is exhibited between the film-shaped firing material and the semiconductor wafer and between the film-shaped firing material and the support sheet during the dicing, and thus chip jump can be prevented. Therefore, the dicing adaptability is excellent. The dicing is not particularly limited, and a method of fixing the peripheral portion (an outer peripheral portion of a support) of the support sheet with the ring frame at the time of dicing the semiconductor wafer and dividing the semiconductor wafer according to a known technique of using a rotary round blade such as a dicing blade is an exemplary example of the dicing method. The film-shaped firing material may be completely cut, and the cut depth of the support sheet resulting from dicing is preferably in a range of 0 to 30 μm from the interface between the film-shaped firing material and the support sheet. By decreasing the amount of the support sheet to be cut, it is possible to suppress fusing of the pressure-sensitive adhesive layer or the base film constituting the support sheet caused by the friction of the dicing blade or generation of burrs and the like. Further, according to the film-shaped firing material with a support sheet of the present embodiment, it is possible to suppress scattering of the firing material during the dicing and to suppress contamination of the wafer.

Further, particularly a chip obtained by dividing the semiconductor wafer having a surface on which a circuit is formed is also referred to as an element or a semiconductor element.

Thereafter, the support sheet may be expanded. In a case where a base film having excellent extensibility is selected as the base film of the support sheet, the support sheet has excellent expandability. By picking up the diced chips with the film-shaped firing material by general means such as a collet, the film-shaped firing material and the support sheet are peeled from each other. As a result, a chip (a chip with the film-shaped firing material) having a film-shaped firing material on the rear surface is obtained. According to the film-shaped firing material with a support sheet according to the present embodiment, since the adhesive force (a2) of the film-shaped firing material to the support sheet is smaller than the adhesive force (a1) of the film-shaped firing material to the semiconductor wafer, and the adhesive force (a2) is 0.5 N/25 mm or less, the film-shaped firing material is likely to be peeled off from the support sheet so that the diced chips with the film-shaped firing material can be easily picked up.

Next, the chip with the film-shaped firing material is attached to the surface of the substrate. The substrate includes a lead frame, a heat sink, and the like. According to the film-shaped firing material with a support sheet of the present embodiment, since the adhesive force is expected to be exhibited between the film-shaped firing material and the substrate, it is possible to prevent the chip position from being shifted while the chip and the substrate are transported in a state of being temporarily fixed by the film-shaped firing material before being fired.

Next, the film-shaped firing material is fired so that the substrate and the chip are sinter-bonded. At this time, in a case where the exposed surface of the film-shaped firing material of the chip with the film-shaped firing material is attached to the substrate, the chip and the substrate can be sinter-bonded through the film-shaped firing material.

The heating temperature of firing the film-shaped firing material may be appropriately determined in consideration of the kind and the like of the film-shaped firing material, but is preferably in a range of 100° C. to 600° C., more preferably in a range of 150° C. to 550° C., and still more preferably in a range of 250° C. to 500° C. The heating time may be appropriately determined in consideration of the kind and the like of the film-shaped firing material, but is preferably in a range of 5 seconds to 60 minutes, more preferably in a range of 5 seconds to 30 minutes, and still more preferably in a range of 10 seconds to 10 minutes.

The film-shaped firing material may be fired by performing pressurizing and firing, in which the film-shaped firing material is fired by being pressurized. The condition for pressurization can be set to be, for example, in a range of 1 to 50 MPa.

According to the method of manufacturing the semiconductor device of the present embodiment, chip jump during the dicing can be suppressed. Further, it is possible to prevent the chip position from being shifted while the chip and the substrate are transported in a state of being temporarily fixed by the film-shaped firing material before being fired. Further, according to the method of producing the semiconductor device of the present embodiment, the film-shaped firing material is likely to be peeled off from the support sheet at the time of picking up the chips divided by dicing the semiconductor wafer so that the diced chips with the film-shaped firing material can be easily picked up. Further, the chip with the film-shaped firing material can be obtained without separately attaching the film-shaped firing material to the rear surface of the divided chip, and thus the production step can be simplified. Further, a substrate with a chip in which the chip and the substrate are sinter-bonded through the film-shaped firing material by disposing the chip with the film-shaped firing material on a desired substrate and firing the substrate and the chip can be produced. In the film-shaped firing material with a support sheet of the present invention used for the method of manufacturing the semiconductor device according to the present embodiment, since the adhesive force (a1) of the film-shaped firing material to the semiconductor wafer and the adhesive force (a2) of the film-shaped firing material to the support sheet satisfy specific conditions, contamination of the wafer and chip jump caused by the friction of the blade during the dicing can be suppressed, and the diced chips with the film-shaped firing material can be easily picked up.

As an embodiment, a chip with the film-shaped firing material which includes a chip and the film-shaped firing material is obtained. As an example, the chip with the film-shaped firing material can be produced using the method of manufacturing a semiconductor device described above.

Further, in the above-described embodiment, the example of sintering and bonding the chip and the substrate of the film-shaped firing material has been described, but the target for sintering and bonding of the film-shaped firing material is not limited to the example described above, and the sintering and bonding can be performed on various products sintered in contact with the film-shaped firing material.

Further, according to the above-described embodiment, the film-shaped firing material having the same shape as the shape of chip can be processed by being divided together with the semiconductor wafer using a blade or the like, and a chip with the film-shaped firing material can be produced. That is, in the chip with the film-shaped firing material, the size (area) of the contact surface of the film-shaped firing material is the same as the size of the contact surface of the chip, but these may be different from each other. For example, the substrate and the chip may be attached to each other through the film-shaped firing material in a state in which the contact surface of the film-shaped firing material is larger than the contact surface of the chip. Specifically, the film-shaped firing material having a desired size is disposed on the substrate, and the chip having a contact surface smaller than that of the film-shaped firing material may be attached to the film-shaped firing material.

EXAMPLES

Hereinafter, the present invention will be described in detail based on the examples, and the scope of the present invention is not limited to these examples and the like.

Examples 1 to 3 and Comparative Examples 1 to 4

<Production of Firing Material Composition>

Components used for producing a firing material composition will be described. Here, metal particles having a particle diameter of 100 nm or less are noted as "sinterable metal particles".

(Sinterable Metal Particle Inclusion Paste Material)

Alconano Ag Paste ANP-1 (organic coated composite silver nanopaste, Nanoparticle Laboratory Corporation: alcohol derivative coated silver particles, metal content of 70% by mass or greater, 60% by mass or greater of silver particles (sinterable metal particles) with average particle diameter of 100 nm or less)

Alconano Ag Paste ANP-4 (organic coated composite silver nanopaste, Nanoparticle Laboratory Corporation: alcohol derivative coated silver particles, metal content of 80% by mass or greater, 25% by mass or greater of silver particles (sinterable metal particles) with average particle diameter of 100 nm or less)

(Binder Component)

Acrylic polymer 1 (2-ethylhexyl methacrylate polymer, mass-average molecular weight of 260000, L-0818, manufactured by The Nippon Synthetic Chemical Industry Co., Ltd., MEK diluted product, solid content of 58.4% by mass, Tg: −10° C.)

Acrylic polymer 2 (2-ethylhexyl methacrylate/n-butyl acrylate copolymer, copolymerization mass ratio of 40/60, mass-average molecular weight of 280000, L-0818B, manufactured by The Nippon Synthetic Chemical Industry Co., Ltd., MEK diluted product, solid content of 60.0% by mass, Tg: −30° C.)

Acrylic polymer 3 (2-ethylhexyl methacrylate/acrylic acid/tert-butyl methacrylate copolymer, copolymerization mass ratio of 47/15/38, mass-average molecular weight of 280000, L-0818C, manufactured by The Nippon Synthetic Chemical Industry Co., Ltd., MEK diluted product, solid content of 60.0% by mass, Tg: −41° C.)

Further, the Tg of each of the acrylic polymers 1 to 3 is a value calculated using the Fox's formula.

Based on the formulation listed in Table 1, firing material compositions of Examples 1 to 3 and Comparative Examples 1 to 4 were obtained by mixing respective components. The value of each component in Table 1 indicates parts by mass. Since the sinterable metal particle inclusion paste material is sold in a state of containing a high-boiling-point solvent and this solvent remains in the film-shaped firing material after coating or drying, the components of the sinterable metal particle inclusion paste material are described together with such components. In consideration of volatilization of the solvent in the binder component at the time of drying, the solid content is noted in terms of parts by mass by removing the solvent component. Further, each numerical value in parentheses in Table 1 indicates the amount (% by mass) of the sinterable metal particles contained in the firing material composition in a case where the total mass of the firing material composition is set to 100% by mass.

<Production of Film-Shaped Firing Material>

One surface of a release film (SP-PET 381031, manufactured by Lintec Corporation, thickness of 38 μm) was coated with the firing material composition obtained in the above-described manner and dried at 150° C. for 10 minutes, thereby obtaining a film-shaped firing material having the thickness listed in Table 1.

<Production of Film-Shaped Firing Material with a Support Sheet>

The obtained film-shaped firing material and the release film were cut into a circular shape with a diameter of 153 mm.

In Examples 1 and 2 and Comparative Examples 1 to 3, the film-shaped firing material which had been cut into a circular shape was attached to the surface of a pressure-sensitive adhesive layer of a dicing sheet using a dicing sheet (Adwill G-011, manufactured by Lintec Corporation) as a support sheet obtained by laminating a pressure-sensitive adhesive layer having a thickness of 10 μm on a base film having a thickness of 70 μm to obtain a film-shaped firing material with a support sheet in which the circular film-shaped firing material and the release film were laminated on the dicing sheet (support sheet) having the pressure-sensitive adhesive layer on the base film.

In Example 3, the film-shaped firing material which had been cut into a circular shape was attached to the surface of a layer formed of polypropylene of a dicing sheet using a dicing sheet (HUSL1302, manufactured by Achilles Corporation) obtained by laminating a layer formed of polypropylene and a layer formed of an ethylene-methacrylic acid copolymer in this order as a support sheet formed of a base film, double-sided tape (G-01DF, manufactured by Lintec Corporation) having a pressure-sensitive adhesive layer on each of both surfaces was cut into a ring shape such that the outer diameter thereof was approximately the same as the outer diameter of the ring frame and the inner diameter thereof was larger than the outer diameter of the film-shaped firing material and was attached to the outer peripheral portion of the film-shaped firing material, and a release film was attached thereto as a protective film. In this manner, a film-shaped firing material with a support sheet, in which the circular film-shaped firing material and the double-side tape for holding a ring frame laminated on the outside of the film-shaped firing material were laminated on the dicing sheet (support sheet) formed of the base film and a release film was laminated on the entire surface thereof was obtained.

In Comparative Example 4, the film-shaped firing material which had been cut into a circular shape was attached to the surface of a release layer of a release film using a release film (SP-PET 502150, manufactured by Lintec Corporation) as a support sheet formed of a base film to obtain a film-shaped firing material with a support sheet in which the circular film-shaped firing material and the release film were laminated on the release film.

<Method of Separating Components Obtained by Removing Sinterable Metal Particles and Non-Sinterable Metal Particles from Film-Shaped Firing Material>

The film-shaped firing material before being fired and an organic solvent with an amount approximately ten times the amount of the film-shaped firing material on a weight basis were mixed, and the solution was stirred for 30 minutes or longer using ultrasonic waves so that the components soluble in the solvent were sufficiently dissolved. Thereafter, the solution was allowed to stand for approximately 30 minutes until the sinterable metal particles and the non-sinterable metal particles were precipitated. The components obtained by removing the sinterable metal particles and the non-sinterable metal particles from the film-shaped firing material were batched off by eliminating the supernatant using a syringe and recovering residues after the solution was dried at 120° C. for 10 minutes.

<Measurement and Evaluation of Film-Shaped Firing Material>

The following items of the obtained film-shaped firing materials were measured and evaluated.

(Measurement of Thickness) The thickness of the film-shaped firing material was measured using a constant pressure thickness-measuring device (product name: "PG-02", manufactured by Techlock, Inc.) in conformity with JIS K 7130.

(Measurement of Tensile Elasticity and Breaking Elongation)

A plurality of film-shaped firing materials from which the release film had been peeled off were laminated such that the thickness thereof was set to 200 μm and were cut such that the width thereof was set to 10 mm and the length thereof was set to 20 mm, and the resultant was used as a test piece for measuring the tensile elasticity and the breaking elongation.

The obtained test piece was fixed to a predetermined site of a universal tensile tester (5581 type tester, manufactured by Instron Corporation) such that the distance between chucks reached 10 mm. In a case where the tensile elasticity and the breaking elongation were measured at 23° C., the load and the elongation of the test piece at the time of being stretched at 23° C. and a tensile rate of 50 mm/min were measured. In a case where the tensile elasticity and the breaking elongation were measured at 60° C., the test piece was heated at 60° C. in an attached heating furnace, and the load and the elongation of the test piece at the time of being stretched at a tensile rate of 50 mm/min were measured. The tensile elasticity [MPa] was acquired from the inclination of the tensile stress in a region where the elongation is in a range of 0% to 5%. Further, the breaking elongation [%] was acquired from the elongation at the time of breakage of the test piece. The results are listed in Table 1.

(Measurement of Glass Transition Temperature)

The components obtained by removing the sinterable metal particles and the non-sinterable metal particles from the film-shaped firing material were separated according to the above-described method.

The components obtained by removing the metal particles from the components constituting the film-shaped firing material before being fired were fused in methyl ethyl ketone (MEK), a polyethylene terephthalate (PET) film on which a peeling treatment was performed was coated with the solution, and the solution was dried so that MEK was volatilized, thereby preparing a film for measuring the glass transition temperature. The obtained film for measuring the glass transition temperature was heated to 150° C. under a condition of a temperature-rising-rate of 10° C./min, a storage elasticity E' and a loss elasticity E" thereof were measured using a dynamic mechanical analyzer (product name: "DMA Q800", manufactured by TA Instruments, Inc.), and tan δ as the ratio (E"/E') of the loss elasticity E" to the storage elasticity E' was plotted with respect to the temperature. The temperature showing the maximum of tan δ was set as the glass transition temperature of the components obtained by removing the metal particles from the components constituting the film-shaped firing material before being fired. The results are listed in Table 1.

(Measurement of Adhesive Force (a1))

A silicon wafer (manufactured by Science & Technology Inst., Co., diameter: 150 mm, thickness: 500 μm) whose surface was subjected to a chemical mechanical polishing treatment until the arithmetic average roughness (Ra) reached 0.02 μm or less was separately prepared as an adherend to adhere.

Next, the film-shaped firing material with a support sheet was attached to the treated surface of the silicon wafer at 50° C. after the surface protective film such as a release film was removed. Next, the support sheet was peeled off from the film-shaped firing material, and a polyethylene terephthalate (PET) film having a thickness of 12 μm was attached to the exposed film-shaped firing material and strongly bonded (lined) thereto. The laminate of the PET film and the film-shaped firing material was notched and cut to have a width of 25 mm and a length of 100 mm or greater, and the laminate formed of the film-shaped firing material and the PET film which was attached to the silicon wafer was obtained.

The obtained laminate was allowed to stand at 23° C. in an atmosphere of a relative humidity of 50% for 20 minutes, and a 180° peeling test was performed thereon using a universal tensile tester (5581 type tester, manufactured by Instron Corporation) in conformity with JIS Z 0237:2000. Specifically, the film-shaped firing material of each example which was lined with the PET film was peeled off from the silicon wafer by peeling the entire PET film at a peeling speed of 300 mm/min. The peeling at this time was carried out by peeling the film-shaped firing material which was lined with the PET film in the length direction thereof such that the angle between the surface of the silicon wafer and the surface of the film-shaped firing material which were in contact with each other reached 180°. Further, the load (peeling force) during this 180° peeling was measured, and the measured value was set as the adhesive force (a1) [N/25 mm]. The results are listed in Table 1. Further, in Examples 2 and 3 and Comparative Examples 1 and 3, since cohesive fracture (a phenomenon in which fracture occurs in a film-shaped firing material layer) occurred in the film-shaped firing material with a support sheet at the value listed in Table 1, the value of a1 was larger than the value listed in the table.

(Measurement of Adhesive Force (a2))

The film-shaped firing material with a support sheet of each example was allowed to stand in an atmosphere of a temperature of 23° C. and a relative humidity of 50% for 20 minutes, and a 180° peeling test was performed thereon using a universal tensile tester (5581 type tester, manufactured by Instron Corporation) in conformity with JIS Z 0237:2000. Specifically, the surface protective film such as a release film was removed from the film-shaped firing material with a support sheet of each example, a polyethylene terephthalate (PET) film having a thickness of 12 μm was attached to the exposed film-shaped firing material and strongly bonded (lined) thereto, and the film-shaped firing material was cut to have a width of 25 mm and a length of 100 mm or greater. The film-shaped firing material was peeled off from the film-shaped firing material with a support sheet which was lined with the PET film by peeling the entire PET film at a peeling speed of 300 mm/min. The peeling at this time was carried out by peeling the film-shaped firing material which was lined with the PET film in the length direction thereof together with the PET film such that the angle between the surface of the support sheet and the surface of the film-shaped firing material which were in contact with each other reached 180°. Further, the load (peeling force) during this 180° peeling was measured, and the measured value was set as the adhesive force (a2) [N/25 mm]. The results are listed in Table 1.

Further, in a case where a dicing sheet (Adwill G-011, manufactured by Lintec Corporation) was used as the support sheet, the dicing sheet and the film-shaped firing material with a support sheet were attached to each other such that the pressure-sensitive adhesive layer of the dicing sheet and the film-shaped firing material of the film-shaped firing material with a support sheet were brought into contact with each other.

(Evaluation of Contamination of Wafer Due to Chipping and Shavings of Firing Material)

A silicon wafer (manufactured by Science & Technology Inst., Co., diameter: 150 mm, thickness: 150 μm) whose surface was subjected to a chemical mechanical polishing treatment until the arithmetic average roughness (Ra) reached 0.02 μm or less was prepared as an adherend to adhere.

The release film was peeled off from the film-shaped firing material with a support sheet, the exposed surface of the film-shaped firing material side was attached to the treated surface of the silicon wafer using a tape mounter (Adwill RAD 2500, manufactured by Lintec Corporation) to obtain a test piece for evaluating chipping and contamination of the wafer.

The obtained test piece was mounted on a ring frame (manufactured by DISCO Corporation) for dicing, and dicing was performed under the following conditions using a dicing device (DFD-651, manufactured by DISCO Corporation). The chip and the silicon wafer after the dicing were observed using a stereoscopic microscope. The presence of chipping or cracking of each of the divided chips to a size with one side of 10 μm or greater was confirmed. Further, the presence of adhesion of shavings of the film-shaped firing material to the surface of the silicon wafer was confirmed. The results are listed in Table 1.

<Various Conditions>
Dicing blade: NBC-ZH2050-SE27HECC, manufactured by DISCO Corporation
Thickness of blade: 0.03 mm
Cutting edge amount: 0.76 mm
Blade rotation speed: 40000 rpm
Cutting speed: 40 mm/sec
Volume of cutting water: 1.0 L/min
Temperature of cutting water: 20° C.

Notching conditions: The silicon wafer and the base film of the support sheet were notched to a depth of 20 μm from the surface of the film-shaped firing material side.
Dicing conditions: Each chip was diced into a size of 5 mm×5 mm.

(Evaluation of Dicing Suitability (Chip Jump and Contamination of Wafer Due to Scattering of Firing Material))

The release film was peeled off from the film-shaped firing material with a support sheet, and the exposed surface of the film-shaped firing material side was attached to a treated surface of a silicon adherend member (diameter of 150 mm, thickness of 500 μm, manufactured by Science & Technology Inst., Co.) having a surface with an arithmetic average roughness Ra of 0.02 μm or less, on which a chemical mechanical polishing treatment had been performed, using a tape mounter (Adwill RAD 2500, manufactured by Lintec Corporation). The silicon wafer to which the obtained film-shaped firing material with a support sheet was attached was mounted on a ring frame (manufactured by DISCO Corporation) for dicing, and a dicing step of cutting the wafer from the silicon adherend side was performed under the following dicing conditions using a dicing device (DFD-651, manufactured by DISCO Corporation) to obtain divided chips with a size of 5 mm×5 mm. The presence of adhesion of shavings formed by cracking of the film-shaped firing material with a support sheet on the surface of the divided wafer, attached to the surface of the film-shaped firing material with a support sheet obtained by the dicing step on the support sheet side, after the dicing step and peeling the cracked material from the wafer and the support sheet was acquired. Further, the presence of chips dropped off from the support sheet during the dicing step was visually acquired.

<Dicing Conditions>
Dicing blade: NBC-ZH2050-SE27HECC, manufactured by DISCO Corporation
Thickness of blade: 0.03 mm
Cutting edge amount: 0.76 mm
Blade rotation speed: 40000 rpm
Cutting speed: 40 mm/sec
Depth of notch to base material of support sheet: 20 μm
Volume of cutting water: 1.0 L/min
Temperature of cutting water: 20° C.

(Evaluation of Pick-Up Step Suitability)

The chips with a size of 5 mm×5 mm which were obtained from the evaluation of the dicing suitability were placed on the substrate at a slider speed of 10 mm/sec under the following pick-up conditions using a die bonder (BESTEM-D02, manufactured by Canon Machinery Inc.). At this time, fifty chips were placed thereon, and the presence of occurrence of pick-up failure such as damage of the chips or stopping of the device without the chips being picked up was confirmed.

<Pick-Up Conditions>
Collet: voidless type
Size of collet: 5 mm×5 mm
Pick-up system: slider type (needleless type)
Width of slider: 5 mm
Expand: 3 mm

TABLE 1

| | | | Example 1 | Example 2 | Example 3 | Comparative Example 1 | Comparative Example 2 | Comparative Example 3 | Comparative Example 4 |
|---|---|---|---|---|---|---|---|---|---|
| Firing material composition | Sinterable metal particle inclusion paste | ANP-1 | 87.7 (>52.6) | 0 | 0 | 0 | 0 | 0 | 0 |
| | | ANP-4 | 0 | 86.8 (>21.7) | 86.8 (>21.7) | 86.8 (>21.7) | 86.8 (>21.7) | 98.2 (>24.5) | 86.8 (>21.7) |

TABLE 1-continued

|  |  | Example 1 | Example 2 | Example 3 | Comparative Example 1 | Comparative Example 2 | Comparative Example 3 | Comparative Example 4 |
|---|---|---|---|---|---|---|---|---|
| material [part by mass] |  |  |  |  |  |  |  |  |
| Binder component [part by mass] | Acrylic polymer 1 | 12.3 | 13.2 | 13.2 | 0 | 0 | 1.8 | 13.2 |
|  | Acrylic polymer 2 | 0 | 0 | 0 | 13.2 | 0 | 0 | 0 |
|  | Acrylic polymer 3 | 0 | 0 | 0 | 0 | 13.2 | 0 | 0 |
|  | Glass transition temperature [° C.] | −10 | −10 | −10 | −30 | 41 | −10 | −10 |
| Sinterable metal particle inclusion paste material/ binder component |  | 7.1 | 6.6 | 6.6 | 6.6 | 6.6 | 54.6 | 6.6 |
| Thickness [µm] |  | 75 | 75 | 75 | 75 | 75 | 75 | 75 |
| Glass transition temperature of components obtained by removing metal particles [° C.] |  | 55 | 55 | 55 | 20 | 90 | 55 | 55 |
| Support sheet |  | G-011 | G-011 | HUSL1302 | G-011 | G-011 | G-011 | SP-PET502150 |
| Adhesive force [N/25 mm] | To semi-conductor wafer (a1) | 1.1 | >1.5 (Cohesive fracture) | >1.5 (Cohesive fracture) | >5.0 (Cohesive fracture) | 0.05 | 0.1 | >1.5 (Cohesive fracture) |
|  | To support sheet (a2) | 0.20 | 0.22 | 0.25 | 0.52 | 0.08 | 0.06 | 0.05 |
| Tensile elasticity [MPa] | 23° C. | 8.5 | 9.9 | 9.9 | 4.0 | 75 | 60 | 9.9 |
|  | 60° C. | 4.5 | 5.3 | 5.3 | 3.0 | 15 | 7.0 | 5.3 |
| Breaking elongation [%] | 23° C. | 580 | 1600 | 1600 | 2000 | 130 | 200 | 1600 |
|  | 60° C. | 620 | 1700 | 1700 | 2200 | 300 | 400 | 1700 |
| Evaluation | Chipping | Not found | Not found | Not found | Found | Not found | Not found | Not found |
|  | Contamination of wafer due to shavings of firing material | Not found | Not found | Not found | Not found | Found | Found | Found |
|  | Contamination of wafer due to scattering of firing material | Not found | Not found | Not found | Not found | Found | Found | Found |
|  | Chip jump | Not found | Not found | Not found | Not found | Found | Found | Found |
|  | Pick-up failure | Not found | Not found | Not found | Found | Not found | Not found | Not found |

As shown in Table 1, in the film-shaped firing materials of Examples 1 to 3 were able to suppress chipping and contamination of the wafer due to shavings of the firing materials as compared with the film-shaped firing materials of Comparative Examples 1 to 3.

Further, as shown in Table 1, the film-shaped firing material with a support sheets of Examples 1 to 3 were able to suppress contamination of the wafer due to shavings of the firing materials and contamination of the wafer due to scattering of the firing materials and chip jump as compared with the film-shaped firing material with a support sheets of Comparative Examples 2 to 4. Further, the film-shaped firing material with a support sheets of Examples 1 to 3 were able to suppress chipping and pick-up failure as compared with the film-shaped firing material with a support sheet of Comparative Example 1.

Each configuration in each embodiment and the combination thereof are merely examples, and addition, omission, substitution, and other modification of configurations can be made within a range not departing from the scope of the present invention. Further, the present invention is not limited to the embodiments and only limited by the scope of the claims.

REFERENCE SIGNS LIST

1: film-shaped firing material
2: support sheet
3: base film
4: pressure-sensitive adhesive layer
5: ring frame
10: sinterable metal particles
20: binder component
100: film-shaped firing material with a support sheet
100a: film-shaped firing material with a support sheet
100b: film-shaped firing material with a support sheet

The invention claimed is:

1. A film-shaped firing material, comprising:
sinterable metal particles; and
a binder component,
wherein a content of the sinterable metal particles is in a range of 15% to 98% by mass,
a content of the binder component is in a range of 2% to 50% by mass,
a tensile elasticity of the film-shaped firing material at 60° C. as measured before being fired is in a range of 4.0 to 10.0 MPa,
a breaking elongation thereof at 60° C. as measured before being fired is 500% or greater, and
a mass ratio of the sinterable metal particles to the binder component in the film-shaped firing material is in a range of 50:1 to 1:1.

2. The film-shaped firing material according to claim 1, wherein a tensile elasticity of the film-shaped firing material at 23° C. as measured before being fired is in a range of 5.0 to 20.0 MPa, and
a breaking elongation thereof at 23° C. as measured before being fired is 300% or greater.

3. The film-shaped firing material according to claim 1, wherein a glass transition temperature of components obtained by removing metal particles from components constituting the film-shaped firing material before being fired is in a range of 30° C. to 70° C.

4. A film-shaped firing material with a support sheet, comprising:
the film-shaped firing material according to any one of claim 1; and
a support sheet which is provided on at least one side of the film-shaped firing material.

5. A film-shaped firing material with a support sheet, comprising:
a film-shaped firing material which contains sinterable metal particles and a binder component; and
a support sheet which is provided on at least one side of the film-shaped firing material,
wherein an adhesive force (a2) of the film-shaped firing material to the support sheet is smaller than an adhesive force (a1) of the film-shaped firing material to a semiconductor wafer, and
the adhesive force (a1) is 0.1 N/25 mm or greater and the adhesive force (a2) is in a range of 0.1 N/25 mm to 0.5 N/25 mm.

6. The film-shaped firing material with a support sheet according to claim 4,
wherein a content of the sinterable metal particles in the film-shaped firing material is in a range of 15% to 98% by mass,
a content of the binder component therein is in a range of 2% to 50% by mass,
a tensile elasticity of the film-shaped firing material at 60° C. as measured before being fired is in a range of 4.0 to 10.0 MPa,
a breaking elongation thereof at 60° C. as measured before being fired is 500% or greater, and
a mass ratio of the sinterable metal particles to the binder component in the film-shaped firing material is in a range of 50:1 to 1:1.

7. The film-shaped firing material with a support sheet according to claim 4,
wherein the support sheet includes a base film and a pressure-sensitive adhesive layer provided on the base film, and
the film-shaped firing material is provided on the pressure-sensitive adhesive layer.

8. A method of manufacturing a semiconductor device using the film-shaped firing material with a support sheet according to claim 4, the method comprising the following steps (1) to (4) in order:
a step (1) of dicing a semiconductor wafer and a film-shaped firing material of a laminate which is obtained by attaching the film-shaped firing material with a support sheet to the semiconductor wafer and in which a support sheet, the film-shaped firing material, and the semiconductor wafer are laminated in this order;
a step (2) of peeling the support sheet off from the diced film-shaped firing material to obtain a chip with the film-shaped firing material;
a step (3) of attaching the chip with the film-shaped firing material to a surface of a substrate; and
a step (4) of firing the film-shaped firing material of the chip with the film-shaped firing material and bonding the chip with the film-shaped firing material and the substrate to each other.

* * * * *